(12) United States Patent
Shoji et al.

(10) Patent No.: US 8,339,017 B2
(45) Date of Patent: Dec. 25, 2012

(54) MULTI-LAYER PIEZOELECTRIC ELEMENT AND INJECTION APPARATUS USING THE SAME

(75) Inventors: Junya Shoji, Kirishima (JP); Masahiro Inagaki, Kirishima (JP); Shigenobu Nakamura, Kirishima (JP)

(73) Assignee: Kyocera Corporation, Kyoto (JP)

( * ) Notice: Subject to any disclaimer, the term of this patent is extended or adjusted under 35 U.S.C. 154(b) by 771 days.

(21) Appl. No.: 12/065,274

(22) PCT Filed: Aug. 29, 2006

(86) PCT No.: PCT/JP2006/316957
§ 371 (c)(1),
(2), (4) Date: Sep. 15, 2009

(87) PCT Pub. No.: WO2007/026687
PCT Pub. Date: Mar. 8, 2007

(65) Prior Publication Data
US 2010/0013359 A1      Jan. 21, 2010

(30) Foreign Application Priority Data

Aug. 29, 2005  (JP) ................................. 2005-247049
Mar. 7, 2006   (JP) ................................. 2006-061352

(51) Int. Cl.
*H01L 41/083* (2006.01)
(52) U.S. Cl. ......... 310/364; 310/328; 310/365; 310/363
(58) Field of Classification Search ........... 310/363–366
See application file for complete search history.

(56) References Cited

U.S. PATENT DOCUMENTS

| | | | |
|---|---|---|---|
| 5,389,851 A * | 2/1995 | Kimura et al. ................. | 310/340 |
| 6,531,806 B1 | 3/2003 | Daidai | |
| 7,294,953 B2 * | 11/2007 | Iwase et al. .................... | 310/366 |
| 7,411,336 B2 * | 8/2008 | Iwase et al. .................... | 310/328 |
| 7,498,727 B2 * | 3/2009 | Nakamura et al. ............. | 310/366 |
| 8,104,693 B2 * | 1/2012 | Ono ............................. | 239/102.2 |
| 8,125,124 B2 * | 2/2012 | Kondo et al. .................. | 310/366 |
| 2004/0178701 A1 * | 9/2004 | Sato et al. ...................... | 310/328 |
| 2005/0120528 A1 | 6/2005 | Okuda et al. .................. | 29/25.35 |
| 2005/0168106 A1 | 8/2005 | Iwase et al. .................... | 310/328 |
| 2005/0231074 A1 * | 10/2005 | Iwase et al. .................... | 310/328 |
| 2007/0216265 A1 * | 9/2007 | Cooke et al. ................... | 310/366 |
| 2010/0282874 A1 * | 11/2010 | Nakamura et al. ............ | 239/585.1 |

FOREIGN PATENT DOCUMENTS

| | | |
|---|---|---|
| EP | 1942533 A1 * | 7/2008 |
| JP | 04-334076 | 11/1992 |
| JP | 04-352481 | 12/1992 |
| JP | 05-036859 | 5/1993 |
| JP | 08-242025 | 9/1996 |
| JP | 09-036450 | 2/1997 |

(Continued)

*Primary Examiner* — Jaydi San Martin
(74) *Attorney, Agent, or Firm* — DLA Piper LLP (US)

(57) ABSTRACT

To provide a multi-layer piezoelectric element having high strength against breakage, high insulation and excellent displacement performance, and an injection apparatus that incorporates the same.

The multi-layer piezoelectric element comprising a stack 4 constituted from a plurality of piezoelectric layers 1 stacked one on another via internal electrode layers 2, wherein at least a part of peripheral areas 31, that are disposed between two piezoelectric layers 1, 1 located adjacently in the stacking direction and are located between an edge 2a of the internal electrode layer 2 and side face 4a of the stack 4, is dispersed areas where a plurality of metallic regions are dispersed via voids 21.

18 Claims, 12 Drawing Sheets

FOREIGN PATENT DOCUMENTS

| | | | |
|---|---|---|---|
| JP | 2000-031558 | | 1/2000 |
| JP | 2000-332312 | | 11/2000 |
| JP | 2001060843 A | | 3/2001 |
| JP | 2001-320099 | | 11/2001 |
| JP | 2004103621 A | * | 4/2004 |
| JP | 2005039199 A | | 2/2005 |
| JP | 2005119146 A | | 5/2005 |
| JP | 2005-174974 | | 6/2005 |
| JP | 2005-223013 | | 8/2005 |
| JP | 2008053467 A | * | 3/2008 |
| WO | WO 2008072767 A1 | * | 6/2008 |

* cited by examiner

MULTI-LAYER PIEZOELECTRIC ELEMENT AND INJECTION APPARATUS USING THE SAME

CROSS-REFERENCE TO THE RELATED APPLICATIONS

This application is a national stage of international application No. PCT/JP2006/316957 filed on Aug. 29, 2006, which also claims benefit of priority under 35 U.S.C. §119 to Japanese Patent Application No. 2005-247049 filed on Aug. 29, 2005 and Japanese Patent Application No. 2006-061352 filed on Mar. 7, 2006, the entire contents of which are incorporated herein by reference.

TECHNICAL FIELD

The present invention relates to a multi-layer piezoelectric element and an injection apparatus, and more particularly to a multi-layer piezoelectric element and an injection apparatus used in, for example, a fuel injection apparatus of an automobile engine; a liquid injection apparatus of an ink jet printer or the like; a drive unit for a precision positioning device; a vibration preventing device for an optical apparatus; a sensor element mounted in a combustion pressure sensor, a knocking sensor, an acceleration sensor, a load sensor, an ultrasound sensor, a pressure sensor, a yaw rate sensor or the like; and circuit component mounted in a piezoelectric gyro, a piezoelectric switch, a piezoelectric transducer, a piezoelectric breaker or the like.

BACKGROUND ART

Piezoelectric actuators have been known as an application of multi-layer piezoelectric elements that are constituted from a plurality of piezoelectric layers stacked via internal electrode layers (metal layers). Piezoelectric actuators can be divided into two categories: fired-at-once type and stacked type which has such a constitution as piezoelectric layers made of piezoelectric porcelain and internal electrode layers having the form of a sheet are stacked alternately one on another. When the requirements to reduce the operating voltage, reduce the manufacturing cost and reduce the thickness and durability are taken into consideration, fired-at-once type piezoelectric actuators are viewed as more advantageous.

FIG. 13A is a perspective view of a multi-layer piezoelectric element of the prior art. This multi-layer piezoelectric element is constituted from a stack 110 and a pair of external electrodes 104 formed on opposing side faces of the stack 110. The stack 110 is formed by stacking a plurality of piezoelectric layers 101 and internal electrode layers 102 alternately one on another. The internal electrode layers 102 are stacked so as to be exposed on opposing side faces of the stack 110 alternately. The pair of external electrodes 104 are formed on the opposing side faces of the stack 110 and the internal electrode layer 102 is connected in every other layer. The external electrode 104 is generally formed by applying an electrically conductive paste that includes an electrically conductive material such as silver and glass to the side faces of the stack 110 and baking (refer, for example, to Patent Document 1: Japanese Unexamined Patent Publication (Kokai) No. 2000-332312, Patent Document 2: Japanese Unexamined Patent Publication (Kokai) No. 2000-31558, Patent Document 3: Japanese Unexamined Patent Publication (Kokai) No. 2005-174974). Inactive layers 109 are formed on both end faces of the stack 110 in the stacking direction.

FIG. 13B is a partial sectional view explaining the constitution of the piezoelectric layers 101 and the internal electrode layers 102 stacked in the multi-layer piezoelectric element described above. As shown in FIG. 13A and FIG. 13B, in the multi-layer piezoelectric element, the internal electrode layers 102 are not formed over the entire principal surface of the piezoelectric layer 101, but are formed in the so-called partial electrode structure where the internal electrode layer 102 has a surface area smaller than that of the piezoelectric layer 101. The stack has the internal electrode layer 102 between two adjacent piezoelectric layers 101 in the stacking direction, and a peripheral area (portion where the internal electrode layer is not formed) between an edge 102a of the internal electrode layer 102 and a side face 110a of the stack 110.

FIG. 14 is a partially enlarged sectional view showing the detail of a junction between the side face of the stack constituting the multi-layer piezoelectric element and external electrodes. As shown in FIG. 14, the stack 110 is constituted from the piezoelectric layers 101 ($101_1, 101_2, \ldots, 101_{n-1}$ ($n \geq 2$)) and the internal electrode layers 102 ($102_1, 102_2, \ldots, 104_{n-1}$ ($n \geq 2$)) stacked alternately one on another. The stack 110 has peripheral areas 111 ($\ldots, 111_m, \ldots 111_{m+1}, \ldots$ ($2 \leq m \leq n-3$)) where the internal electrode layer 102 is not formed on the principal surface of the piezoelectric layer 101, the peripheral areas 111 being disposed so as to alternately adjoin the pair of external electrodes 104. In this constitution, the internal electrode layers 102 are exposed on different side faces of the stack 110 alternately in every other layer, and are connected to the pair of external electrodes 104 formed on the opposing side faces of the stack 110 in every other layer.

When the multi-layer piezoelectric element is used as a piezoelectric actuator, lead wires 106 are fastened onto the external electrodes 104 by soldering, and a predetermined voltage is applied across the pair of external electrodes 104 via the lead wires 106 so as to drive the multi-layer piezoelectric element. In recent years, as the multi-layer piezoelectric element becomes smaller and is required to undergo a greater amount of displacement under a higher pressure, there is a demand for a multi-layer piezoelectric element that can be operated continuously over a longer period of time with an electric field of higher intensity applied thereto.

However, in the multi-layer piezoelectric element of the prior art, since the internal electrode layer 102 has the partial electrode structure as described above, applying a voltage across the external electrodes 104, 104 causes displacement only in the portion that is interposed between the two internal electrode layers 102 located above and below the piezoelectric layer 101, namely in the portion (displacement portion) where one of the internal electrode layers 102 overlaps with another internal electrode layer 102. The piezoelectric layer 101 does not undergo displacement in the portion (undisplaceable portion) of the piezoelectric layer 101 where the internal electrode layer 102 is not formed (the portion adjacent to the peripheral portion 111), as shown in FIG. 13B and FIG. 14. For example, the piezoelectric layers $101_{m-1}, 101_m$ located in the stacking direction on both sides of the peripheral area $111_m$ of the internal electrode layer $102_m$ are interposed between the internal electrode layers $102_{m-1}, 102_{m+1}$ of the same polarity. As a result, the piezoelectric layers $101_{m-1}, 101_m$ located in the stacking direction on both sides of the peripheral area $111_m$ are not subjected to the electric field, and therefore do not undergo displacement. Moreover, since the two piezoelectric layers $101_{m-1}, 101_m$ located on both sides of the peripheral area $111_m$ in the stacking direction are firmly joined to each other, there is such a problem that the peripheral area $111_m$ restricts the displacement of the entire stack, thereby decreasing the amount of displacement of the element. Similar problems exist also with the other peripheral area such as the peripheral area $111_{m+2}$. The peripheral areas 111 provide the functions of ensuring insulation for alternately connecting the internal electrode layers 102 to the pair of external electrodes 104, and increasing the strength of the multi-layer piezoelectric element against breakage by joining the piezoelectric layers 101 with each other without the internal electrode layer 102 interposed therebetween.

DISCLOSURE OF THE INVENTION

As described previously, the recently increasing demand for small multi-layer piezoelectric elements capable of ensuring a greater amount of displacement has prompted such measures to be taken as increasing the number of piezoelectric layers and the internal electrode layers, or applying a higher electric field so as to increase the amount of displacement.

With the structure of the multi-layer piezoelectric element of the prior art, however, there is a peripheral area where the internal electrode layer is not formed, and therefore the piezoelectric layer formed therein does not undergo displacement even when a voltage is applied across the external electrodes, which has the effect of restricting the movement of the displacement portion. At the same time, the peripheral area must have a certain extent so as to ensure the insulation and strength against breakage. In other words, the distance between the edge of the internal electrode layer and the side face of the stack cannot be decreased. However, increasing the peripheral area leads to a problem of lower displacement performance due to an increase in the restricting force. When the peripheral area is decreased, on the other hand, strength against breakage and the insulation become lower.

Accordingly, an object of the present invention is to provide a multi-layer piezoelectric element having high strength against breakage, high insulation and excellent displacement performance, and an injection apparatus that incorporates the same.

The multi-layer piezoelectric elements of the present invention are as follows:

(1) A multi-layer piezoelectric element comprising a stack constituted from a plurality of piezoelectric layers stacked one on another via internal electrode layers, wherein at least a part of peripheral areas, that are disposed between two piezoelectric layers located adjacently in the stacking direction and are located between an edge of the internal electrode layer and a side face of the stack, is dispersed area where a plurality of regions consisting of an inorganic compound are dispersed via voids.

(2) The multi-layer piezoelectric element described in (1), wherein the regions consisting of the inorganic compound are metallic regions consisting of a metal, and the metallic regions are dispersed in the dispersed area while being insulated from the internal electrode layer.

(3) A multi-layer piezoelectric element comprising a stack constituted from a plurality of piezoelectric layers stacked one on another via internal electrode layers, wherein at least a part of peripheral areas, that are disposed between two piezoelectric layers located adjacently in the stacking direction and are located between an edge of the internal electrode layer and a side face of the stack, is dispersed area where a plurality of metallic regions consisting of a metal are dispersed while being insulated from the internal electrode layer.

(4) The multi-layer piezoelectric element described in (2) or (3), wherein the metallic regions are formed from a silver-palladium alloy.

(5) The multi-layer piezoelectric element described in any one of (1) to (4), wherein the regions consisting of an inorganic compound are ceramic regions consisting of ceramics, and a plurality of ceramic regions are dispersed in the dispersed area.

(6) The multi-layer piezoelectric element described in (5), wherein the ceramic regions connect two piezoelectric layers located adjacently in the stacking direction of the stack.

(7) The multi-layer piezoelectric element described in (5) or (6), wherein the ceramic regions are formed from the same piezoelectric ceramics as the piezoelectric layers.

(8) A multi-layer piezoelectric element comprising a stack constituted from a plurality of piezoelectric layers stacked one on another via internal electrode layers, wherein at least part of peripheral areas, that are disposed between two piezoelectric layers located adjacently in the stacking direction and are located between an edge of the internal electrode layer and a side face of the stack, is dispersed areas where regions consisting of a resin are dispersed via voids.

(9) The multi-layer piezoelectric element described in any one of (1) to (8), wherein the dispersed area includes said voids more than the internal electrode layer.

(10) The multi-layer piezoelectric element described in any one of (1) to (9), wherein the distance between the edge of the internal electrode layer and the side face of the stack is longer in the peripheral area that includes the dispersed area than in the peripheral area that does not include the dispersed area.

(11) The multi-layer piezoelectric element described in any one of (1) to (10), wherein the stack has two or more dispersed areas that have different distances between the edge of the internal electrode layer and side face of the stack

(12) The multi-layer piezoelectric element described in any one of (1) to (10), wherein the stack has a plurality of dispersed areas, and two or more piezoelectric layers are disposed between two dispersed areas which are adjacent to each other in the stacking direction.

(13) The multi-layer piezoelectric element described in (12), wherein the plurality of dispersed areas are disposed at equal intervals in the stacking direction of the stack.

(14) The multi-layer piezoelectric element described in any one of (1) to (8), wherein each of the peripheral areas of the stack has the dispersed area formed in at least a part thereof.

(15) The multi-layer piezoelectric element described in any one of (1) to (14), wherein the stack has a pair of external electrodes formed on the side face thereof, the external electrodes being electrically connected to the plurality of internal electrode layers in every other layer, and part of the external electrode infiltrating into a part of the peripheral area.

(16) The multi-layer piezoelectric element described in (15), wherein said part of the external electrode infiltrates between the plurality of regions that constitute the dispersed area.

(17) The multi-layer piezoelectric element described in (15) or (16), wherein the peripheral area has voids that are formed so as to communicate from the edge of the internal electrode layer to a part of the external electrode.

(18) The multi-layer piezoelectric element described in any one of (15) to (17), wherein the stack has a plurality of the peripheral areas into which part of the external electrodes infiltrates, and the peripheral areas are disposed in an ordered arrangement in the stacking direction of the stack.

(19) The multi-layer piezoelectric element described in any one of (15) to (18), wherein a main component of the metallic region is the same as the main component of the external electrodes.

(20) The multi-layer piezoelectric element described in any one of (1) to (19), wherein a cover layer made of a resin is formed on the side faces of the stack, and a part of the cover layer infiltrates into a part of the peripheral area.

An injection apparatus comprising a container having an injection hole and the multi-layer piezoelectric element described in any one of (1) to (20), wherein a liquid contained in the container is ejected from the injection hole by the multi-layer piezoelectric element.

Effect of the Invention

The multi-layer piezoelectric element described in (1) makes it possible to decrease the restrictive force of the undisplaceable portion that restricts the displacement of the displacement portion, since at least a part of the peripheral area is formed as the dispersed area where a plurality of regions consisting of an inorganic compound are dispersed via voids. Also because the above-mentioned regions are dispersed via the voids in the peripheral area, strength of the device against breakage and the insulation can be suppressed from decreasing. This enables high reliability and high displacement performance to be achieved at the same time. As a result, a large amount of displacement can be maintained even when the number of layers in the stack is made less than that of the prior art, and therefore the multi-layer piezoelectric element can be made more compact. Also a large amount of displacement can be maintained even when the voltage applied is made lower than that of the prior art. Moreover, short-circuiting can be prevented from occurring across electrodes more reliably by decreasing the applied voltage.

In the present invention, the expression "a plurality of regions consisting of an inorganic compound are dispersed via voids" means that a plurality of the above-mentioned regions are disposed in the state of being isolated from each other via voids between two piezoelectric layers that are disposed adjacently in the stacking direction.

In the multi-layer piezoelectric element described in (2), the regions consisting of the inorganic compound are metallic regions consisting of a metal, and the dispersed area is constituted from the plurality of metallic regions dispersed in the state of being insulated from the internal electrode layer. As the dispersed area is constituted from the plurality of dispersed metallic regions that are more pliable than the piezoelectric ceramics that constitutes the piezoelectric layers, the restrictive force of the undisplaceable portion that restricts the displacement of the displacement portion can be decreased. Also because the metallic regions are dispersed via the voids, the contact area between the metallic region and the piezoelectric layer can be decreased, and therefore the force of the metallic regions to clamp the piezoelectric layer can be decreased. While compressive stress and tensile stress are distributed in a complicated manner when the multi-layer piezoelectric element undergoes displacement, the dispersed area of the present invention constituted from the plurality of dispersed metallic regions makes it possible for the metallic regions included in one dispersed area to mitigate the compressive stress and tensile stress that act in various directions at the same time. Also because the plurality of metallic regions are dispersed in the state of being insulated from the internal electrode layer, insulation of the peripheral area can be prevented from deteriorating.

In the multi-layer piezoelectric element described in (3), at least a part of the peripheral areas is formed as the dispersed area where the metallic regions consisting of a metal are dispersed while being insulated from the internal electrode layer. Since the multi-layer piezoelectric element has the dispersed area constituted from the plurality of dispersed metallic regions that are more pliable than the piezoelectric layers, it is made possible to decrease the restrictive force of the undisplaceable portion that restricts the displacement of the displacement portion and suppress the strength of the device against breakage and the insulation from deteriorating.

When the metallic region is formed from the silver-palladium alloy as described in (4), alloys consisting of the component elements in any proportions may be used since the silver-palladium alloy dissolves totally into a solid solution. Since the use of this alloy enables various firing temperatures to be employed, a relaxation layer can be sintered at the same time as the multi-layer piezoelectric element is fired. Also because the silver-palladium alloy shows a high surface tension when melted, the metallic layer formed from the silver-palladium alloy is less likely to have sharp edges. As a result, an arc-shaped meniscus is formed in the interface of bonding, and therefore a stress relaxation effect can be increased without having the stress concentrated locally in the metallic layer. When the internal electrode layers are also formed from the silver-palladium alloy, difference in the thermal expansion between the internal electrode layer and the piezoelectric layer during the sintering process can be made uniform over substantially the entire surface of the piezoelectric layer, and therefore stress can be suppressed from being generated by the differences in thermal expansion.

In the multi-layer piezoelectric element described in (5), the regions consisting of the inorganic compound are ceramic regions consisting of ceramics, and the dispersed area is constituted from the plurality of ceramic regions dispersed therein. As the dispersed area is constituted from the plurality of dispersed ceramic regions, stress generated therein can be distributed over the piezoelectric layers that make contact with the ceramic regions.

Moreover, the piezoelectric layers that are in direct contact with the ceramic region where stress is concentrated can absorb the stress through a change in the crystalline structure that occurs in accordance to the intensity of the stress. When the crystalline structure of the piezoelectric layers that is in contact with the ceramics changes, crystalline structure of the piezoelectric layers that is not in contact with the ceramics (the piezoelectric layers in contact with the voids) also changes, so that the stress is not concentrated and is distributed throughout the dispersed area. That is, rather than the ceramic region per se directly relieving the stress, an indirect stress relaxation effect is achieved by making advantage of the change in the crystalline structure of the piezoelectric layers that makes contact with the ceramic region. In addition, when the metal regions as well as the ceramic regions are provided via the voids, the stress relaxation effect can be improved further due to the combined effect with that described above. That is, quick impact is mitigated by the stress relaxation effect of the piezoelectric layers and impact of high intensity is mitigated by the stress relaxation effect of the metallic layers, and therefore the highest stress relaxation effect can be achieved when the dispersed areas include metallic regions and ceramic regions that are formed from a piezoelectric material.

Moreover, when the ceramic regions connect two piezoelectric layers located adjacently in the stacking direction of the stack as describe in (6) above, strength of the device against breakage can be improved by preventing the bonding strength between these piezoelectric layers from decreasing too much and, at the same time, stress generated in the ceramic regions can be distributed among the two piezoelectric layers that makes contact with the ceramic region, thereby mitigating the stress.

When the ceramic regions are formed from the same piezoelectric material as that of the piezoelectric layers, the ceramic region per se can absorb the stress generated in the ceramic region through a change in the crystalline structure that occurs in accordance to the intensity of the stress. Also the existence of the ceramic regions dispersed via the voids results in the separation of the ceramic regions, where stress is concentrated, from each other. When the crystalline structure of the ceramic region changes in accordance to the stress, each of the ceramic regions achieves the stress relaxation effect with substantially no influence on the crystalline structure of the ceramic region located in the vicinity thereof. Moreover, since the crystalline structure of the ceramic layers that make contact with the ceramic region also changes in accordance to the stress at this time, stress due to the change in crystalline structure can be absorbed in the dispersed area and in the vicinity thereof without concentrating the stress only in the ceramic region. Also because the stress relaxation is based on phase transition due to ion displacement in the crystalline structure, deformation can proceed at a higher rate in the ceramic regions formed from the piezoelectric material than in the metallic region. As a result, a stress relaxation layer having a quick response capability can be made that is capable of accommodating the stress generated by high speed impact.

The dispersed area may also have such a configuration as a plurality of regions made of resin are dispersed via voids as described in (8) above. Since the dispersed areas are constituted from the plurality of dispersed resin regions that are more pliable than the piezoelectric material that constitutes the piezoelectric layers, it is made possible to decrease the restrictive force of the undisplaceable portion that restricts the displacement of the displacement portion.

As described in (9), it is preferable that the dispersed areas include more voids than the internal electrode layer has. That is, since more voids are included in the peripheral areas than in the internal electrode layer between the two piezoelectric layers located adjacently in the stacking direction, a sufficient contact area between the internal electrode layer and the piezoelectric layer can be secured in the displacement portion. In the undisplaceable portion, on the other hand, the dispersed areas are capable of surely mitigating the restrictive force of the undisplaceable portion that restricts the displacement of the displacement portion and mitigating the stress generated in the border between the displacement portion and the undisplaceable portion.

In the multi-layer piezoelectric element described in (10), the distance between the edge of the internal electrode layer and side face of the stack is longer in the peripheral area that includes the dispersed area than in the peripheral area that does not include the dispersed area. With this configuration, since the stress relaxation layer can be formed to straddle the position where stress is concentrated in the border between the displacement portion and the undisplaceable portion, the restrictive force of the undisplaceable portion that restricts the displacement of the displacement portion can be improved with a smaller number of dispersed areas.

In the multi-layer piezoelectric element described in (11), the stack has two or more dispersed areas that have different distances between the edge of the internal electrode layer and side face of the stack. The highest concentration of the stress occurs in the border between the displacement portion and the undisplaceable portion. If the distance between the edge of the internal electrode layer and side face of the stack becomes more uniform, the stress becomes more likely to concentrate in the device. Therefore, it is preferable to form a plurality of dispersed areas that have different distances between the edge of the internal electrode layer and side face of the stack, without making the distance between the edge of the internal electrode layer and side face of the stack uniform. The dispersed area where the distance is longer may be disposed in a portion which is particularly prone to stress in the stacking direction of the stack so as to improve the effect of reducing the restrictive force, or the dispersed area where the distance is shorter may be disposed in a portion that requires particularly high strength against breakage so as to increase the strength.

The strength of the device against breakage can be maintained at a high level when the stack has a plurality of dispersed area and two or more piezoelectric layers are disposed between the dispersed area located adjacently in the stacking direction as described in (12). In addition, when a plurality of dispersed areas are disposed at equal intervals in the stacking direction of the stack as described in (13), the restrictive force of the undisplaceable portion can be decreased substantially uniformly over the entire extent of the device in the stacking direction. In this case, stress can be distributed without concentrating in a particular position.

According to the present invention, the amount of displacement of the device can be increased further by forming the dispersed area in at least a part of each of all the peripheral areas in the stack as described in (14). Such a configuration significantly decreases the restrictive force of the undisplaceable portion that restricts the displacement of the displacement portion, and therefore provides a greater amount of displacement.

In the multi-layer piezoelectric element described in (15), the pair of external electrodes are formed on the side faces of the stack and are electrically connected to the plurality of internal electrode layers in every other layer, while part of the external electrodes infiltrate into part of the peripheral areas. This constitution results in such a structure that can be likened to piles that are driven into the stack through the side faces thereof, thus significantly-increasing the bonding strength between the external electrodes and the stack. As a result, the external electrodes can be prevented from peeling off the side face of the stack, even when the device is continuously operated over a long time under a high electric field and a high pressure, so that good connection between the external electrodes and the internal electrode layers can be maintained and the displacement characteristic can be prevented from lowering. Moreover, when the external electrode and the metallic region are continuously bonded to each other, stress generated in the device due to the external electrodes can be mitigated by making use of the stress relaxation effect of the metallic region.

It is preferable that a part of the external electrode infiltrates between a plurality of the regions that constitute the dispersed area, as described in (16). This increases the bonding strength between the external electrodes and the stack further. When the above-mentioned regions are metallic regions, bonding strength of the external electrodes can be increased further by the bond between the metal that constitutes the metallic regions and the metal that constitutes the external electrodes, as a part of the external electrode infiltrates between the metallic regions.

When the peripheral area has voids that are formed so as to communicate from the edge of the internal electrode layer to a part of the external electrode as described in (17), the amount of displacement can be increased further because the force that restricts two piezoelectric layers located adjacently in the stacking direction can be effectively decreased.

When there are a plurality of the peripheral areas where a part of the external electrode infiltrates and the peripheral areas are disposed in an ordered arrangement in the stacking direction of the stack as described in (18), the external electrodes are bonded firmly and substantially uniformly over the entire length in the stacking direction of the stack.

When the main component of the metallic region is the same as the main component of the external electrodes as described in (19), the components of the external electrode and the metallic region can diffuse into each other when the external electrodes are formed, so that bonding strength between the external electrodes and the stack increases and the anchoring effect of the external electrodes is improved. As a result, it is made possible to prevent the external electrodes from peeling off the side face of the stack, even when the device is continuously operated over a long time under a high electric field and a high pressure, so that good connection between the external electrodes and the internal electrode layer can be maintained and the displacement characteristic can be prevented from lowering. Moreover, since the external electrode and the metallic region can have thermal expansion coefficients of comparable values, it is made possible to make the stress due to the difference in the thermal expansion coefficient between the external electrode and the piezoelectric layer and the stress due to the difference in the thermal expansion coefficient between the metallic region and the piezoelectric layer proximate to each other regardless of variations in the ambient temperature of the multi-layer piezoelectric element during use. As a result, since the external electrode and the metallic region have a smaller difference in the stress generated therein, stress generated in the device due to the external electrodes can be mitigated by making use of the stress relaxation effect of the metallic region.

In the multi-layer piezoelectric element described in (20), the cover layer is formed from a resin on the side face of the stack, and a part of the cover layer infiltrates into a part of the peripheral area. As a result, since such a structure is formed that can be likened to piles (part of cover layer) that are driven into the stack through the side faces thereof, bonding strength between the cover layer and the stack is greatly improved. As a result, the cover layer is prevented from peeling off the side face of the stack, even when the device is continuously operated over a long time under a high electric field and a high pressure. Therefore, it is made possible to maintain sufficient insulation of the external electrodes and the internal electrode layer from the outside of the device and prevent the displacement characteristic from deteriorating. Moreover, since the cover layer and the metallic region are continuously bonded to each other, stress generated in the device due to the cover layer can be mitigated by making use of the stress relaxation effect of the metallic region. Even when stress is generated due to the difference in the thermal expansion, the stress generated in the device due to the external electrodes can be mitigated by making use of the stress relaxation effect of the metallic region.

The injection apparatus of the present invention described in (21) has such a constitution that comprises the container having the ejection hole and the multi-layer piezoelectric element described above, so that the liquid held in the container is ejected through the injection hole by the operation of the multi-layer piezoelectric element, and therefore high discharge performance and high durability are provided.

Figure 1A:
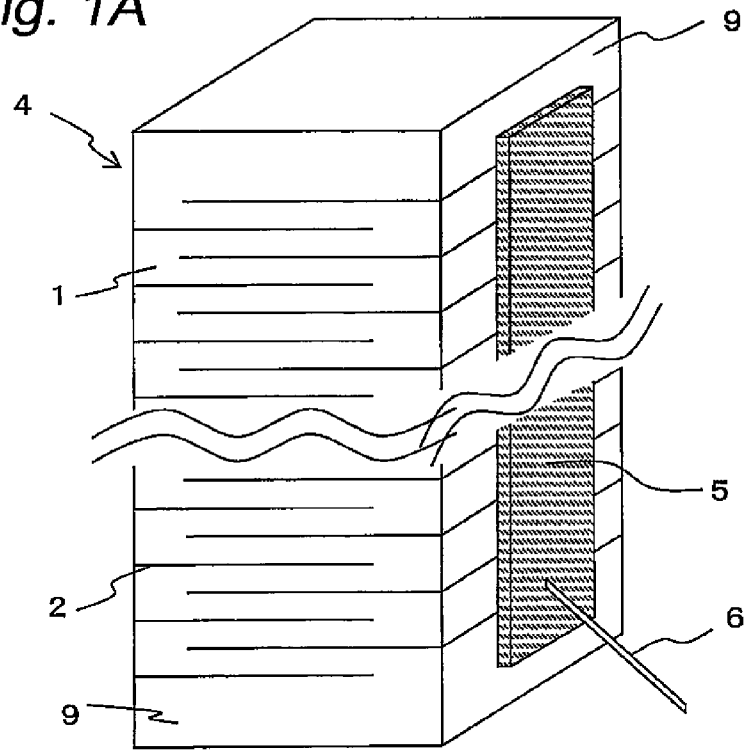
FIG. 1A is a perspective view showing the multi-layer piezoelectric element according to a first embodiment of the present invention.

BRIEF DESCRIPTION OF REFERENCE NUMERALS 1, 1a, 1b: Piezoelectric layer
2: Internal electrode layer
2a: Edge of internal electrode layer
3: Metallic region
4: Stack
4a: Side face of stack 4
5: External electrode
6: Lead wire
31: Peripheral area
51: Insulating ceramics
61: Porous area

BEST MODE FOR CARRYING OUT THE INVENTION

Multi-Layer Piezoelectric Element

First Embodiment

Figure 1B:
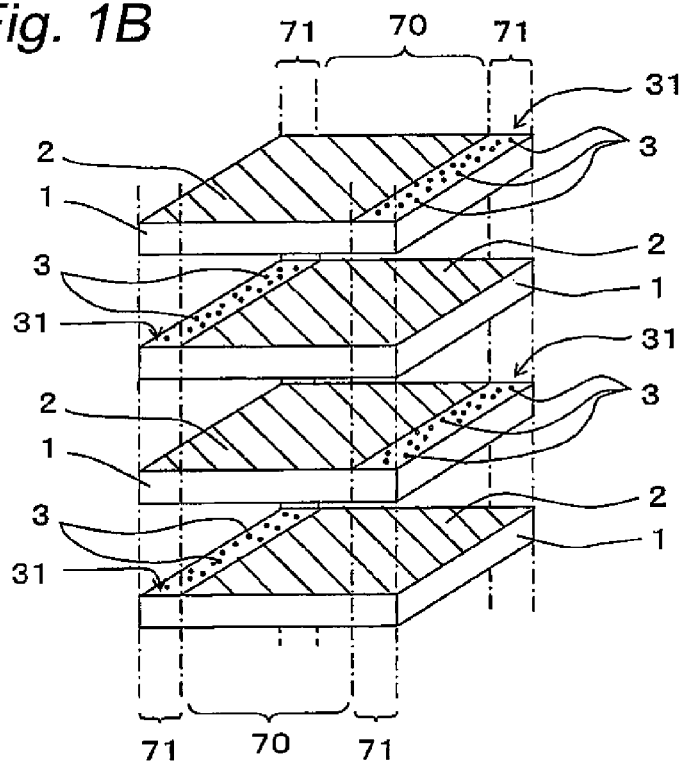
FIG. 1B is a partial perspective view showing the state of the piezoelectric layers and the internal electrode layers being stacked in the multi-layer piezoelectric element shown in FIG. 1A.
Figure 2:
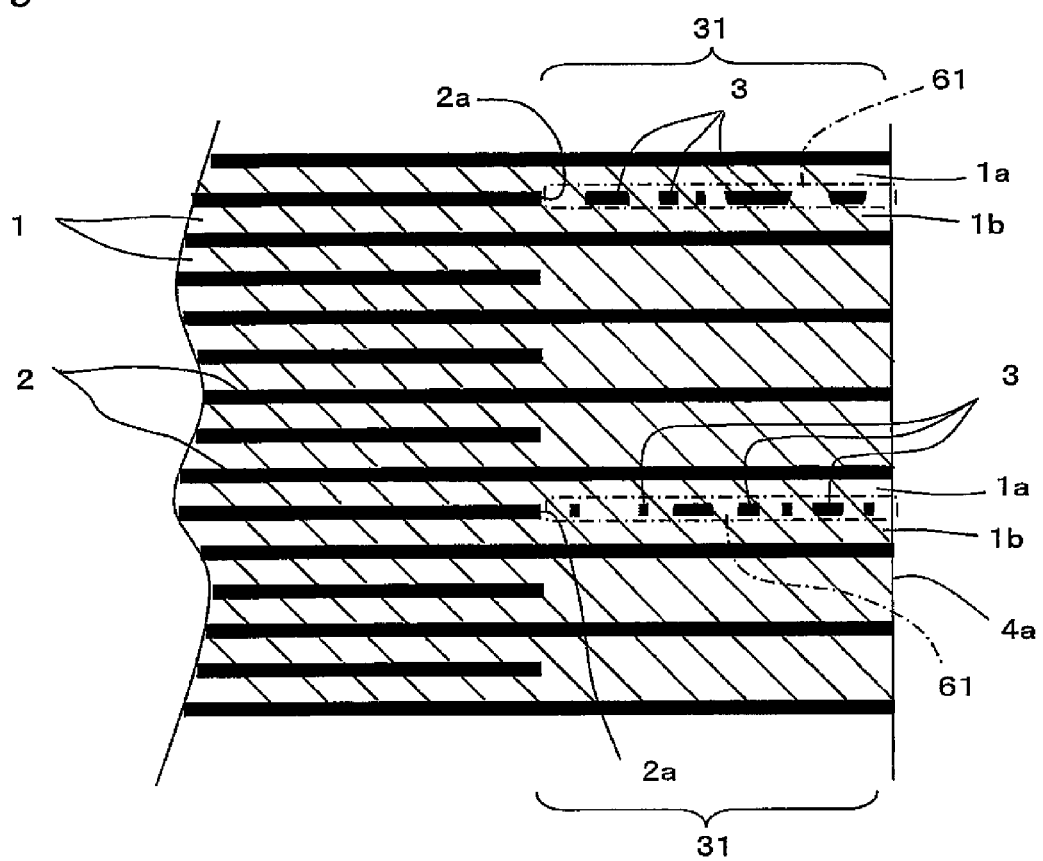
FIG. 2 is a partially enlarged sectional view showing the state of the piezoelectric layers and the internal electrode layers being stacked in the multi-layer piezoelectric element of the first embodiment.

The multi-layer piezoelectric element according to the first embodiment of the present invention will be described below with reference to the accompanying drawings. FIG. 1A is a perspective view showing the multi-layer piezoelectric element according to this embodiment. FIG. 1B is a partial sectional view showing the state of the piezoelectric layers and the internal electrode layers (metal layers) being stacked in the multi-layer piezoelectric element. FIG. 2 is a partially enlarged sectional view showing the structure of the piezoelectric layers and the internal electrode layers being stacked in the multi-layer piezoelectric element of the first embodiment As shown in FIG. 1A and FIG. 1B, the multi-layer piezoelectric element has a stack 4 formed by stacking a plurality of piezoelectric layers 1 via internal electrode layers 2. The stack 4 has, formed on a side face thereof, a pair of external electrodes 5 connected to the plurality of internal electrode layers 2 in every other layer. The plurality of internal electrode layers are not formed over the entire principal surface of the piezoelectric layer 1, so that a so-called partial electrode structure is formed where the internal electrode layer 2 has a surface area smaller than the area of the principal surface of the piezoelectric layer 1. The internal electrode layers 2 are exposed alternately on opposing side faces of the stack 4.

In this multi-layer piezoelectric element, since the internal electrode layers 2 are formed in the partial electrode structure as described above, when a voltage is applied across the external electrodes 5, 5, only the portion of the piezoelectric layer 1 that is interposed between two internal electrode layers 2 from above and below, namely the region where one of the internal electrode layers 2 overlaps the other internal electrode layer 2 in the stacking direction (displacement portion 70), undergoes displacement. The piezoelectric layer 1 does not undergo displacement in the portion thereof where the internal electrode layer 2 is not formed (peripheral area 31) as shown in FIG. 1B (undisplaceable portion 71).

When the multi-layer piezoelectric element of the present invention is used as a piezoelectric actuator, lead wires 6 are fastened onto the external electrodes 5 by soldering, with the lead wires 6 being connected to an external voltage source. When a predetermined voltage is applied across the pair of external electrodes 5, 5 from the external voltage source via the lead wires 6, the piezoelectric layers 1 undergo displacement due to a reverse piezoelectric effect.

As shown in FIG. 1B and FIG. 2, the multi-layer piezoelectric element has a plurality of peripheral areas 31 located between two piezoelectric layers 1, 1 that are disposed adjacently in the stacking direction and are located between the edge of the internal electrode layer 2 and the side face 4a of the stack 4. In the multi-layer piezoelectric element of this embodiment, the peripheral area 31 located between the piezoelectric layer 1a and the piezoelectric layer 1b, among the plurality of piezoelectric layers 1, has a dispersed area 61 formed therein from a plurality of dispersed metallic regions 3 made of a metal. The dispersed areas 61 are formed over substantially the entire area of the peripheral area 31 (the plurality of metallic regions 3 are distributed over substantially the entire peripheral area 31). Instead of the metallic regions 3, regions of another material that is more pliable to undergo deformation than the piezoelectric ceramics may be dispersed. The term "deformation" includes any form of deformation such as elastic deformation, plastic deformation or the like. Any form such as gas, liquid, solid or gel may be used as the material that is more pliable to undergo deformation than the piezoelectric ceramics.

As described above, the regions 3 of this embodiment are the metallic regions 3 made of a metal. The metallic regions 3, 3, . . . are dispersed in the peripheral area 31 while being insulated from the internal electrode layers 2. The phrase "dispersed while being insulated from the internal electrode layers 2" means such a state as the plurality of metallic regions 3 are not electrically connected to the internal electrode layers 2, and the metallic regions 3 are isolated from each other and are not electrically connected to each other.

There is no restriction on the position of the stack 4 where the dispersed areas 61 are to be disposed, among the plurality of peripheral areas 31 included in the stack 4. For example, the dispersed areas 61 may be formed in all of the peripheral areas 31 (the peripheral areas 31 that adjoin all of the internal electrode layers 2), or the dispersed areas 61 may be formed in arbitrarily selected peripheral areas 31. In the first embodiment, there are a plurality of the peripheral areas 31 wherein the dispersed areas 61 are formed, and the dispersed areas 61 are disposed at intervals of two or more piezoelectric layers 1 in the stacking direction of the stack 4.

The metallic regions 3 may be formed from the same material as that used to form the internal electrode layer 2, and are preferably formed from a silver-palladium alloy. The silver-palladium alloy is a pliable metal that deforms relatively easily, and therefore even a low content thereof can reduce the restrictive force of the undisplaceable portion. The silver-palladium alloy is also resistant to fatigue and has high resistance against oxidization, and is therefore capable of suppressing the durability of the multi-layer piezoelectric element from deteriorating. There are no restrictions on the shape and size of the metallic regions 3 and on the number of the metallic regions 3 formed in the peripheral area 31. The minimum requirement is that the metallic regions 3 are dispersed as described above.

The proportion of the total area of the metallic regions 3 to the area of the peripheral area 31 when the peripheral area 31 having the dispersed areas 61 formed therein is viewed in the stacking direction of the stack 4 is preferably from 0.1 to 50%, more preferably from 5 to 30%. When the proportion of the metallic regions 3 is less than 0.1%, the effect of reducing the restrictive force of the undisplaceable portion that restricts the displacement of the displacement portion may not be achieved. When the proportion of the metallic regions 3 is more than 50%, on the other hand, the strength against breakage and the insulation capability may become lower. There is no restriction on the maximum size r of the metallic region 3 when viewed in the stacking direction of the stack 4. However, forming the metallic regions too large may lead to deterioration in the strength against breakage and in the insulation capability. The maximum size r of the metallic region 3 is preferably not larger than one half, and more preferably not larger than one tenth of the minimum distance L between the internal electrode layer 2 and the external electrode 5 in the peripheral area 31. For example, when the minimum distance L is about 1 mm, the maximum size r of the metallic region 3 is preferably 500 μm or less, and more preferably 100 μm or less.

In this embodiment, the peripheral area 31 where the dispersed areas 61 are formed includes insulating ceramic regions in part or the entire area between adjoining metallic regions 3, so that the insulating ceramic regions connect the adjoining piezoelectric layers 1a, 1b together. While there is no restriction on the kind of ceramic material that is disposed between the adjoining metallic regions 3 and connects the adjoining piezoelectric layers 1a, 1b together, it is preferably the same material as that of the piezoelectric layers 1. When lead zirconate titanate is used as the material to form the piezoelectric layers 1, it is preferable to use lead zirconate titanate as the insulating ceramic material that connects the piezoelectric layers 1 together in the peripheral area 31. This constitution prevents trouble arising from the difference in thermal expansion and achieves higher bonding strength between the piezoelectric layers 1.

The peripheral areas 31 where the dispersed areas 61 are formed are preferably disposed at equal intervals in the stacking direction of the stack 4. Specifically, it is preferable that a plurality of the metallic regions 3 are dispersed in the plurality of peripheral areas 31 that are located between the edge 2a of the internal electrode layer 2 located at equal intervals via two or more piezoelectric layers 1 and selected from among the plurality of the internal electrode layers 2, and the side face 4a of the stack 4. As the metallic regions 3 are dispersed in the plurality of peripheral areas 31 that are selected so as to be located at equal intervals, displacement performance and strength against breakage can be set at more well-balanced levels.

There is no restriction on the kind of material of the piezoelectric layer 1, for which various piezoelectric ceramics may be used. For example, a compound having a Bi layer lattice (perovskite type compound having a Bi layer lattice), tungsten bronze type compound, Nb-based perovskite type compound (niobate alkaline compound (NAC) such as sodium niobate, niobate alkaline earth compound (NAEC) such as barium niobate, lead magnesium niobate (PMN), lead nickel niobate (PNN), lead zirconate titanate (PZT) including Pb, lead titanate or another perovskite type compound may be used. Among these, a perovskite type compound that includes at least lead is preferably used. For example, it is preferable to use a material that includes lead magnesium niobate (PMN), lead nickel niobate (PNN), lead zirconate titanate (PZT) including Pb or lead titanate. Among these, lead zirconate titanate or lead titanate is preferably used in particular, in order to achieve a large amount of displacement. The piezoelectric ceramic material preferably has a high value of piezoelectric strain constant $d_{33}$, which represents the piezoelectric characteristic thereof.

The internal electrode layer 2 may be formed from any material that has electrical conductivity, such as gold, silver, palladium, platinum, copper, aluminum or an alloy thereof. As the alloy, for example, a silver-palladium alloy—may be used. The thickness of the internal electrode layer 2 should be such that ensures electrical conductivity and does not impede displacement, and is generally in a range from about 0.5 to 7 μm, and preferably from about 1 to 5 μm. The thickness of the piezoelectric layer 1, namely the distance between the internal electrode layers 2 is preferably in a range from about 50 to 200 μm. When the piezoelectric layer 1 is too thick, the actuator cannot be made in a compact and a low-profile construction. When the piezoelectric layer 1 is too thin, insulation breakdown is likely to occur. The external electrodes 5 may be formed from any material that has electrical conductivity, such as gold, silver, palladium, platinum, copper, aluminum, nickel or an alloy thereof.

Now a method for manufacturing the multi-layer piezoelectric element of this embodiment will be described. First, a calcined powder of a piezoelectric ceramic material constituted from a perovskite type oxide such as lead zirconate titanate ($PbZrO_3$—$PbTiO_3$), a binder made of an organic polymer such as acrylic resin or butyral resin and a plasticizer such as DBP (dibutyl phthalate) or DOP (dioctyl phthalate) are mixed to form a slurry. The slurry is formed into ceramic green sheets by a known method such as a doctor blade process or a calender roll process or another tape molding method.

Then a metal powder such as a silver-palladium alloy that would form the internal electrode layer 2, a binder and a plasticizer are mixed to prepare an electrically conductive paste, that is applied onto the top surfaces of the ceramic green sheets by a screen printing method or the like to a thickness of, for example, from 1 to 40 μm. At this time, the metallic regions 3 are formed so as to be dispersed in the area where the internal electrode layer is not formed (peripheral 31) by the screen printing method. The metallic regions 3 may be dispersed by spraying or a vapor deposition process, or partially removing a metal layer formed in the form of a film by etching or a sandblasting technique.

Then a plurality of the ceramic green sheets having the electrically conductive paste printed thereon are stacked one on another, with the compact stack being heated at a predetermined temperature to remove the binder. The stack is then fired at a temperature in a range from 900 to 1,200° C. thereby to make the stack 4.

Silver powder, glass powder and a binder are mixed to prepare an electrically conductive silver-glass paste. The electrically conductive paste is printed on opposing side faces 4a, 4a of the stack 4 by a method such as screen printing and is, after being dried, baked at a temperature in a range from 500 to 800° C., thereby forming the external electrodes 5. Instead of printing, a sheet with a thickness of 5 μm or less formed by drying the glass paste may be attached by baking.

Then the stack 4 having the external electrodes 5 formed thereon is dipped in a silicone rubber solution. After deaerating the silicone rubber solution in a vacuum, the stack 4 is pulled out of the silicone rubber solution with the side faces of the stack 4 being coated with the silicone rubber. Then the silicone rubber coating on the side faces of the stack 4 is hardened thereby to complete the multi-layer piezoelectric element of the present invention.

Last, lead wires are connected to the external electrodes 5, and a DC voltage of 3 kV/mm is applied across the pair of external electrodes 5 via the lead wires so as to apply a polarization treatment to the stack 4, thereby completing the piezoelectric actuator that employs the multi-layer piezoelectric element of the present invention. The lead wires are connected to an external voltage source that supplies the voltage via the lead wires and the external electrodes to the metal layer 2, so that the piezoelectric layers 1 undergo significant displacement due to a reverse piezoelectric effect. Thus the device functions as, for example, an automobile fuel injection valve that injects fuel to an engine.

Second Embodiment

Figure 3:
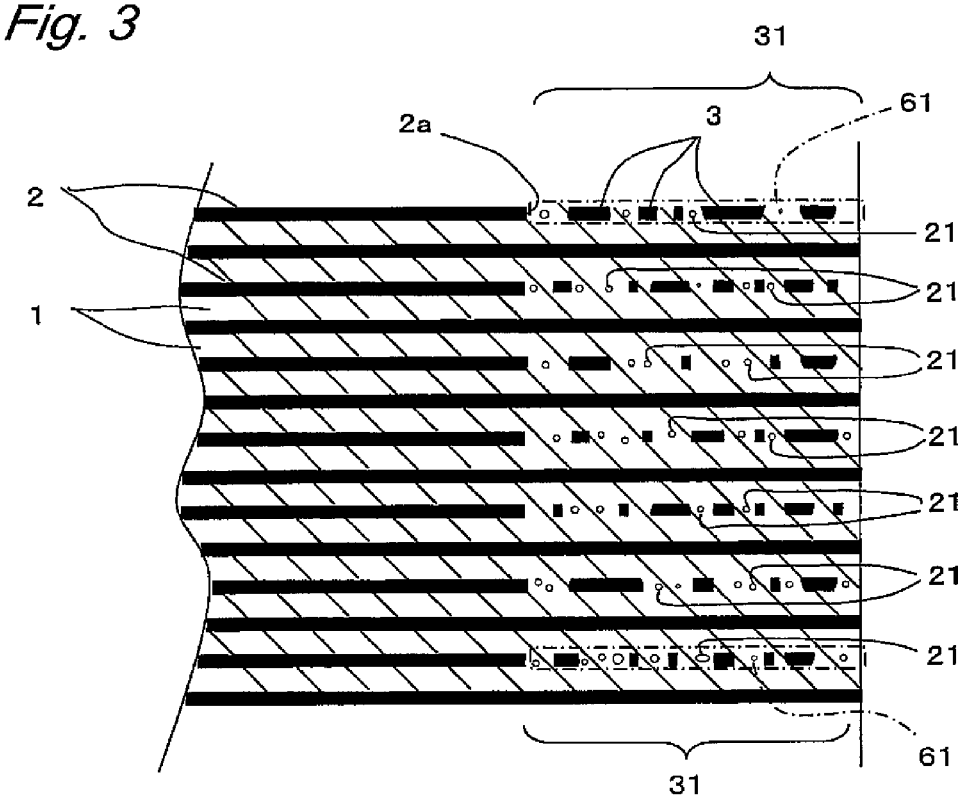
FIG. 3 is a partially enlarged sectional view showing the state of the piezoelectric layers and the internal electrode layers being stacked in a multi-layer piezoelectric element of a second embodiment.

FIG. 3 is a partial sectional view showing the structure of the piezoelectric layers 1 and the internal electrode layers 2 being stacked in the multi-layer piezoelectric element according to the second embodiment of the present invention. As shown in FIG. 3, the multi-layer piezoelectric element of this embodiment has voids 21 formed between neighboring regions 3, 3 in the dispersed area 61. In other words, the dispersed area 61 includes the metallic regions 3, that are more pliable to undergo deformation than the piezoelectric ceramics that constitute the piezoelectric layers 1, and the voids 21. The dispersed area 61 includes the plurality of metallic regions 3 that are dispersed therein while being insulated from the internal electrode layer 2, and the plurality of voids 21 dispersed therein. There are the voids 21 located between the neighboring metallic regions 3, 3. The existence of the voids 21 between the neighboring metallic regions 3, 3 ensures insulation so that the neighboring metal pieces are not in continuity with each other. The existence of the voids 21 between the neighboring metallic regions 3 also provides a space that allows the metallic regions 3 to deform more easily, thereby decreasing the restrictive force of the undisplaceable portion further.

In the embodiment shown in FIG. 3, the dispersed area 61 includes insulating ceramics region located between the neighboring metallic regions 3, 3, so that the insulating ceramic regions connect the neighboring piezoelectric layers 1 together. The plurality of voids 21 are dispersed in the insulating ceramic regions. While this embodiment is a case where the voids 21 are formed in the insulating ceramic regions, only the insulating ceramic regions may exist between the neighboring metallic regions, or both the voids 21 and the insulating ceramic regions may exist.

The voids 21, that are dispersed between the metallic regions 3 in the peripheral area 31 where the dispersed areas 61 are formed, may be formed as follows. In order to form only the voids, a resin that is decomposed during a degreasing process such as acrylic beads or paraffin may be mixed in the electrically conductive paste used to form the internal electrode layer, which is applied as described above. A binder may also be printed on the portion where voids are formed. In order to form both the voids 21 and the insulating ceramic regions between the neighboring metallic regions 3, 3 in the peripheral area 31, an insulating ceramic material may be mixed in the electrically conductive paste. A description of the other portions which are identified with the same reference numerals as those in FIGS. 1 and 2 is omitted.

Third Embodiment

Figure 4:
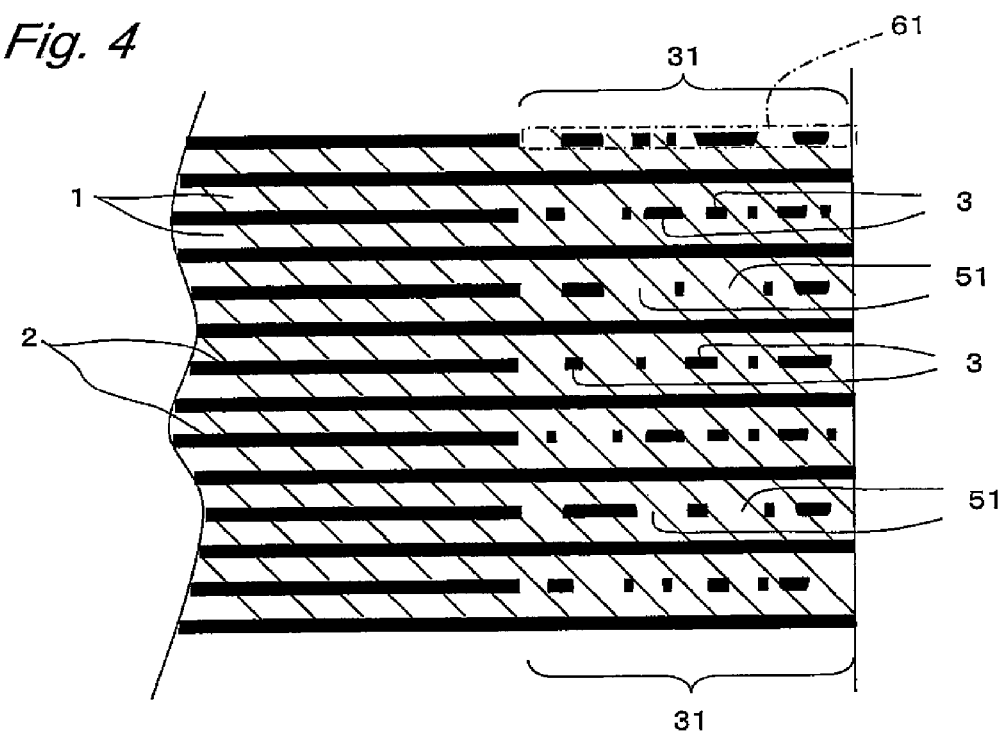
FIG. 4 is a partially enlarged sectional view showing the state of the piezoelectric layers and the internal electrode layers being stacked in a multi-layer piezoelectric element of a third embodiment.

FIG. 4 is a partially enlarged sectional view showing the structure of the piezoelectric layers 1 and the internal electrode layers 2 being stacked in the multi-layer piezoelectric element according to the third embodiment of the present invention. As shown in FIG. 4, the multi-layer piezoelectric element of this embodiment has the dispersed area 61 formed in a plurality of peripheral areas 31 (that is, in all peripheral areas 31) located between the edges 2a of all the internal electrode layers 2 and the side faces 4a of the stack 4. FIG. 4 gives an enlarged view of a portion in the vicinity of one side face of the stack 4, without showing the side face that opposes this side face. The dispersed areas 61 are formed also in all of the peripheral areas 31 in the vicinity of the opposite side face. This constitution significantly reduces the restrictive force of the undisplaceable portion that restricts the displacement of the displacement portion, thereby greatly improving the displacement performance of the multi-layer piezoelectric element. In the multi-layer piezoelectric element of this embodiment, the dispersed area 61 includes insulating ceramics 51 in a part of the area or the entire area between the neighboring metallic regions 3, so. that the insulating ceramics 51 connect the neighboring piezoelectric layers 1 together. A description of the other portions which are identified with the same reference numerals as those in FIGS. 1 through 3 is omitted.

Fourth Embodiment

Figure 5:
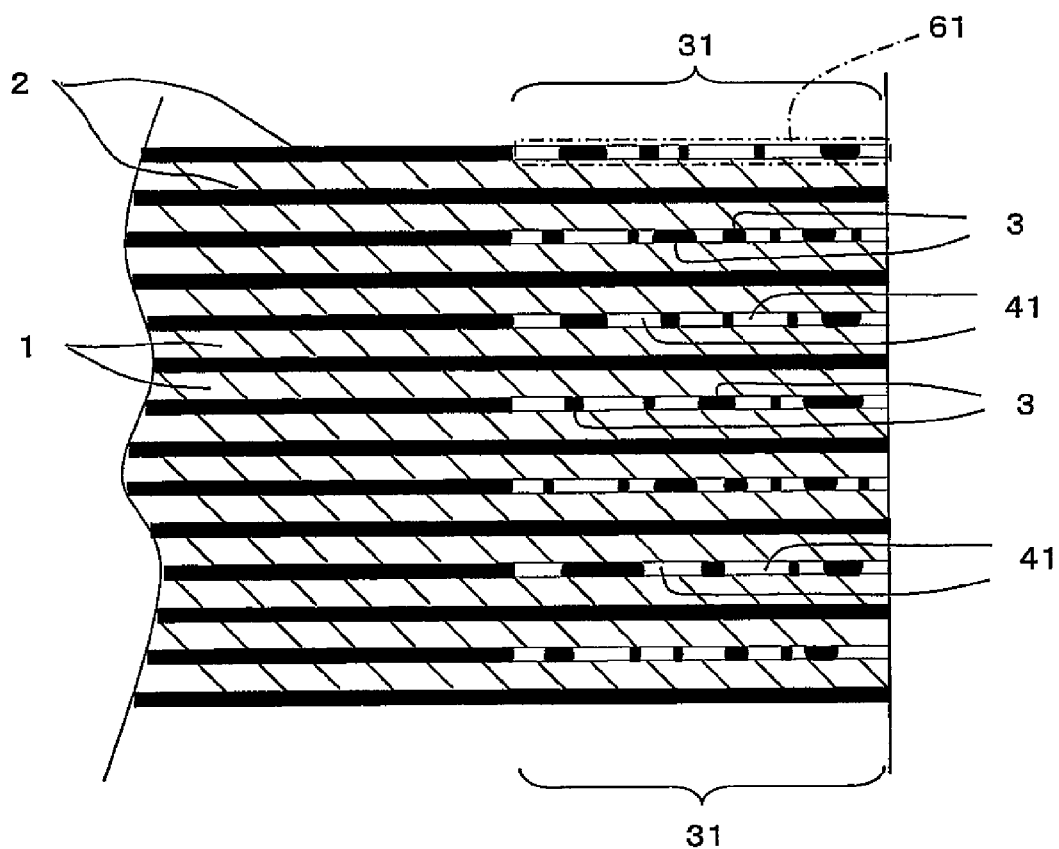
FIG. 5 is a partially enlarged sectional view showing the state of the piezoelectric layers and the internal electrode layers being stacked in a multi-layer piezoelectric element of a fourth embodiment.

FIG. 5 is a partially enlarged sectional view showing the structure of the piezoelectric layers 1 and the internal electrode layers 2 being stacked in the multi-layer piezoelectric element according to the fourth embodiment of the present invention. As shown in FIG. 5, the multi-layer piezoelectric element of this embodiment has the peripheral areas 31, where the dispersed areas 61 are formed, disposed in plurality in the stacking direction of the stack 4. These dispersed areas 61 include the metallic regions 3 and voids 41 dispersed therein in plurality. The dispersed area 61 of this embodiment consists mainly of the metallic regions 3 and the voids 41. Since the dispersed area 61 includes less insulating ceramic regions than in the case of the third embodiment shown in FIG. 3, the device undergoes a larger amount of displacement. The dispersed area 61 of this embodiment also includes more voids than the internal electrode layer 2 does. Comparison of the number of voids may be made by measuring the void ratio in the metal layers. The void ratio can be measured by a method to be described later. A description of the other portions which are identified with the same reference numerals as those in FIGS. 1 through 3 is omitted.

Fifth Embodiment

Figure 6:
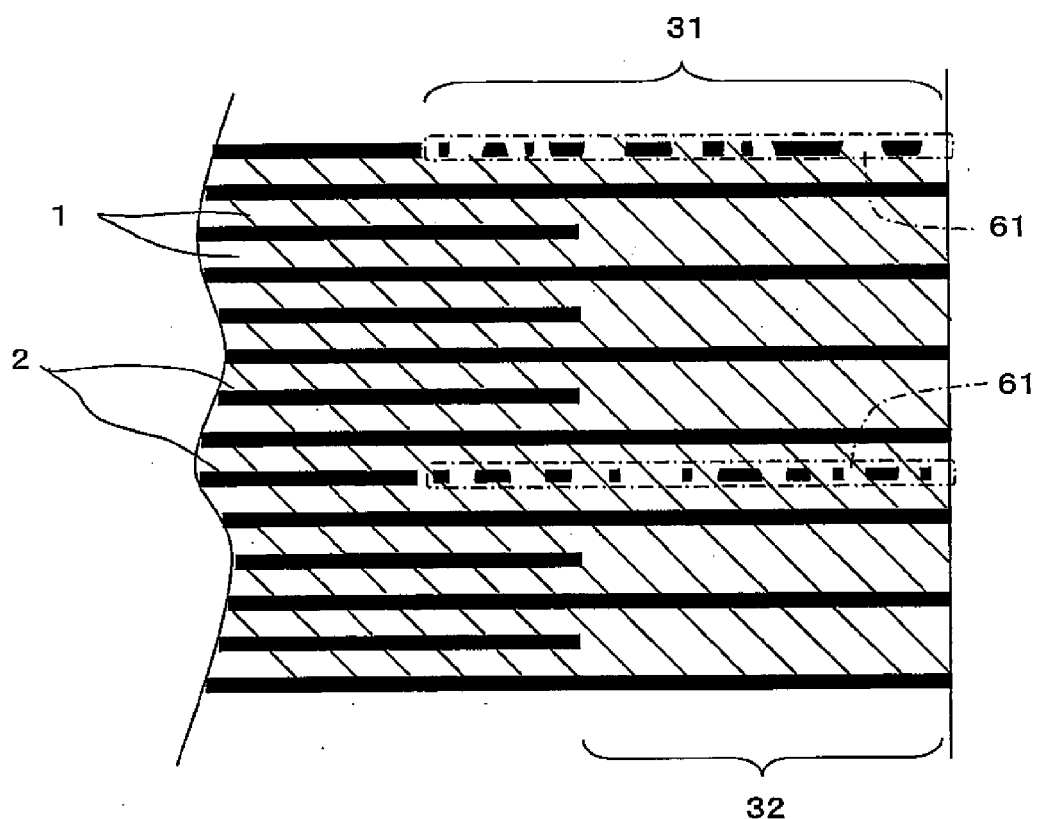
FIG. 6 is a partially enlarged sectional view showing the state of the piezoelectric layers and the internal electrode layers being stacked in a multi-layer piezoelectric element of a fifth embodiment.

FIG. 6 is a partially enlarged sectional view showing the structure of the piezoelectric layers 1 and the internal electrode layers 2 being stacked in the multi-layer piezoelectric element according to the fifth embodiment of the present invention. As shown in FIG. 6, in the multi-layer piezoelectric element of this embodiment, the peripheral areas 31, where the dispersed areas 61 are formed, are larger than peripheral areas 32 where the dispersed areas are not formed. The phrase "the peripheral areas 31 where the dispersed areas 61 are formed are larger than the peripheral areas 32 where the dispersed areas are not formed" means that the distance between the edges 2a of the internal electrode layers 2 and the side face 4a of the stack 4 is longer. Comparison may also be made in terms of the surface area of the peripheral areas 31 or the peripheral areas 32 viewed in the stacking direction of the stack 4. In this case, the surface area of the peripheral areas 31 is larger than that of the peripheral areas 32. Forming such a structure as the peripheral areas 31 where the metallic regions 3 are dispersed are larger than the peripheral areas 32 where the metallic regions 3 are not dispersed makes it possible to reduce the restrictive force of the undisplaceable portion that restricts the displacement of the displacement portion, even when there are a smaller number of the peripheral areas 31 where the metallic regions 3 are dispersed. A description of the other portions which are identified with the same reference numerals as those in FIGS. 1 through 3 is omitted.

Sixth Embodiment

Figure 7:
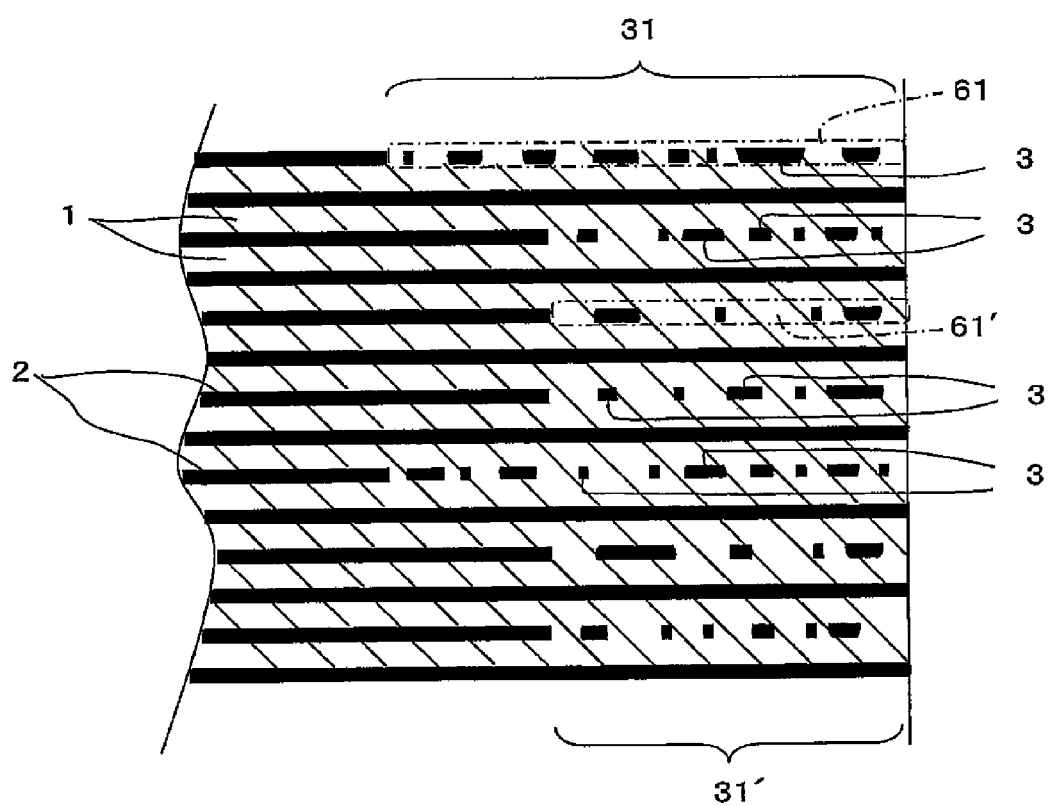
FIG. 7 is a partially enlarged sectional view showing the state of the piezoelectric layers and the internal electrode layers being stacked in a multi-layer piezoelectric element of a sixth embodiment.

FIG. 7 is a partially enlarged sectional view showing the structure of the piezoelectric layers 1 and the internal electrode layers 2 being stacked in the multi-layer piezoelectric element according to the sixth embodiment of the present invention. As shown in FIG. 7, in the multi-layer piezoelectric element of this embodiment, there are plurality of the peripheral areas 31, 31', where the distance between the edge of the internal electrode layer and the side face of the stack is different, disposed in plurality in the stacking direction of the stack 4. And there are dispersed areas, where a plurality of metallic regions 3 are dispersed while being insulated from the internal electrode layer 2, formed in the peripheral areas 31, 31'. Such a structure can reduce the restrictive force further. A description of the other portions which are identified with the same reference numerals as those in FIGS. 1 through 3 is omitted.

Seventh Embodiment

Figure 8:
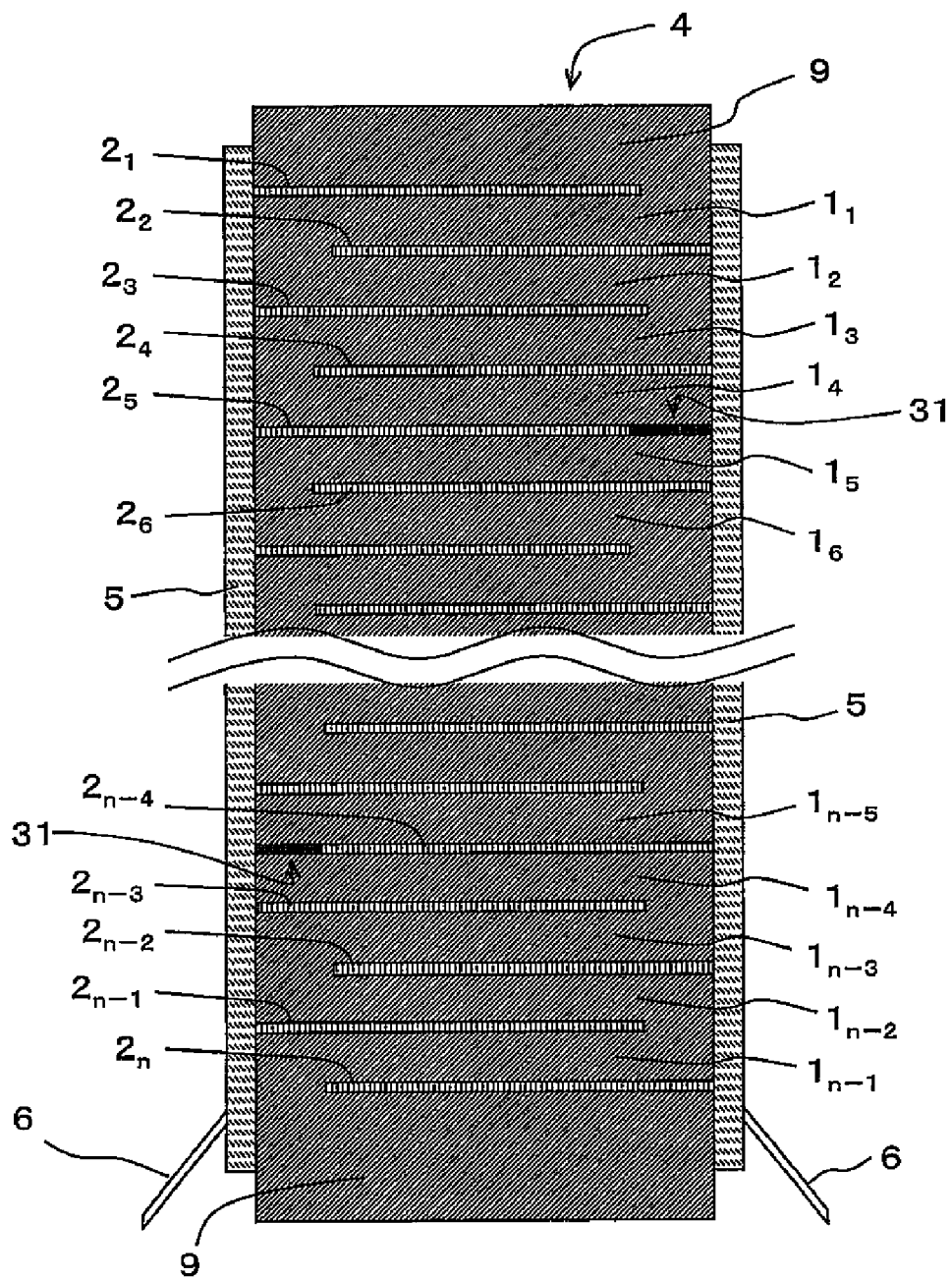
FIG. 8 is a sectional view showing a multi-layer piezoelectric element of a seventh embodiment.
Figure 9:
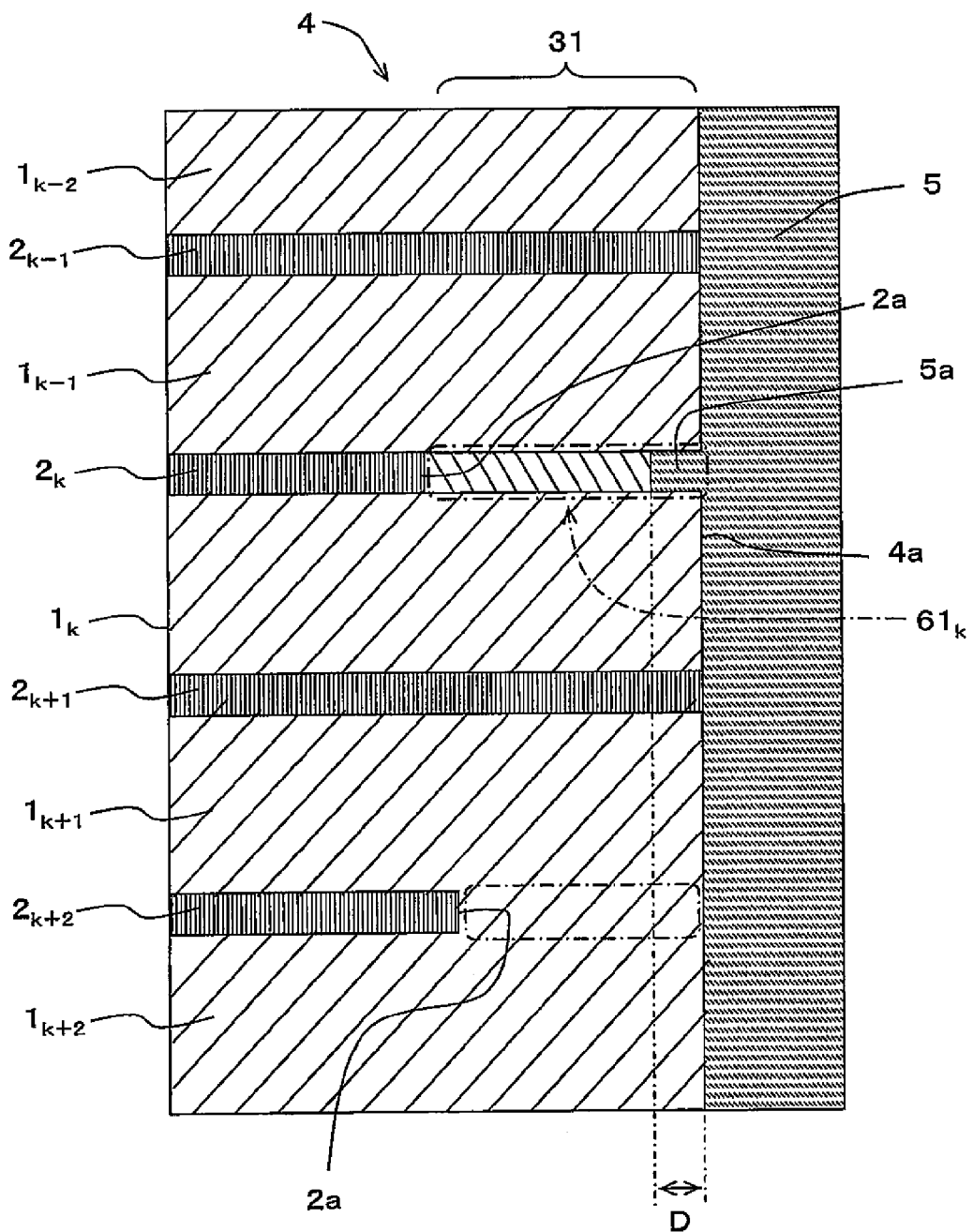
FIG. 9 is a partially enlarged sectional view showing a portion where the external electrodes and the side face of the stack are bonded together in the multi-layer piezoelectric element of the seventh embodiment.

FIG. 8 is a sectional view showing the multi-layer piezoelectric element according to the seventh embodiment. FIG. 9 is an enlarged sectional view showing a portion where the external electrodes and the side face of the stack are bonded together in this embodiment. As shown in FIGS. 8, and 9, the multi-layer piezoelectric element of this embodiment has the stack 4 constituted from a plurality of piezoelectric layers 1 ($1_1, 1_2, \ldots, 1_{n-1}$ ($n \geq 2$)) and a plurality of internal electrode layers 2 ($2_1, 2_2, \ldots, 2_{n-1}, 2_n$ ($n \geq 2$)) stacked alternately one on another, where a pair of external electrodes S are formed on the opposing side faces of the stack 4, to which the ends of the internal electrode layers 2 are connected in every other layer. The lead wire 6 is connected to each of the external electrodes 5 by soldering or the like. The lead wires 6 are connected to an external voltage source (not shown).

When a predetermined voltage is applied via the lead wires 6 to the piezoelectric layers 1, the piezoelectric layers 1 undergo displacement due to a reverse piezoelectric effect. Inactive layers 9 consisting of a plurality of the piezoelectric layers are disposed on both end faces of the stack 4 in the stacking direction. These inactive layers 9 have the internal electrode layer 2 disposed only on one of the principal surfaces, without the internal electrode layer disposed on the other principal surface, and therefore do not undergo displacement if a voltage is applied.

As shown in FIGS. 8 and 9, the internal electrode layer $2_k$ and the peripheral area 31 located between the edge 2a of the internal electrode layer $2_k$ and the side face 4a of the stack 4 are disposed between two piezoelectric layers $1_{k-1}$, $1_k$ ($2 \leq k < n-1$), which are selected from among the plurality of piezoelectric layers $1_1, 1_2, \ldots, 1_{n-1}$.

The internal electrode layer $2_k$ consists mainly of a metal and voids, and contributes to the displacement of the piezoelectric layers $1_{k-1}$, $1_k$ that adjoin thereto. In the peripheral area 31 located between the edge 2a of the internal electrode layer $2_k$ and the side face 4a of the stack 4, among the plurality of peripheral areas 31 of the stack 4, there is the dispersed area $61_k$ that include regions that are more pliable to undergo deformation than the piezoelectric ceramics that constitute the piezoelectric layers 1. No dispersed area is formed in the peripheral area 31 located between the edge 2a of the internal electrode layer $2_{k+2}$ and the side face 4a of the stack 4, which is filled with the same piezoelectric ceramics as that of the piezoelectric layers $1_{k+1}$, $1_{k+2}$ that adjoin both ends in the stacking direction.

Figure 10:
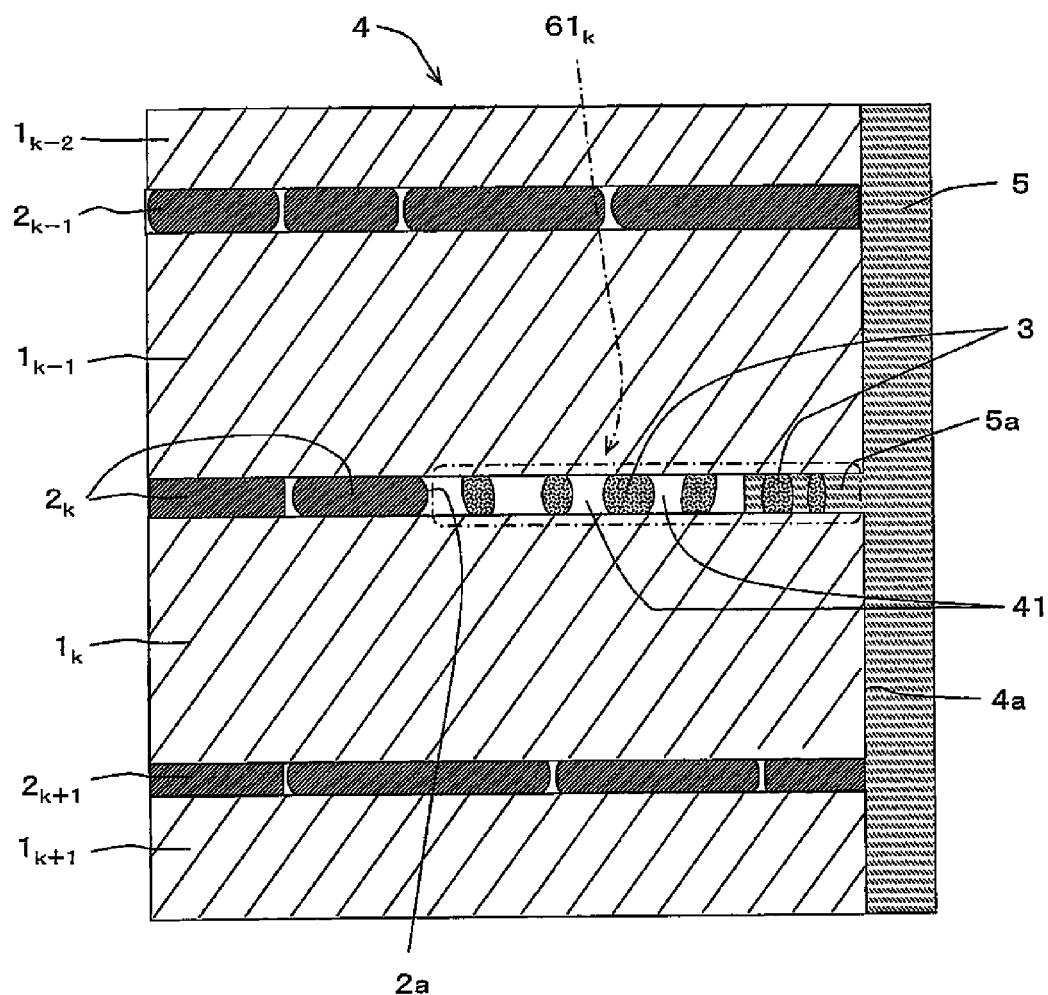
FIG. 10 is a partially enlarged sectional view showing an example of the peripheral area in the multi-layer piezoelectric element of the seventh embodiment.

FIG. 10 is a partially enlarged sectional view showing an example of the peripheral area of this embodiment. As shown in FIG. 10, the dispersed area $61_k$ includes the metallic regions 3 and the voids 41. That is, in the case of this embodiment, the "regions that are more pliable to undergo deformation" described above are the metallic regions 3 made of a metal and the voids 41, where a plurality of the metallic regions 3 are dispersed in the dispersed area $61_k$ while being insulated from the internal electrode layer 3 via the voids 41. The dispersed area $61_k$ is capable of decreasing the restrictive force of the undisplaceable portion that restricts the displacement of the displacement portion. Also because the dispersed area $61_k$ has the above-mentioned regions dispersed therein, strength of the device against breakage and the insulation can be suppressed from decreasing. This enables high reliability and high displacement performance at the same time. The dispersed area $61_k$ also contributes to stress relaxation during displacement.

As shown in FIG. 10, the peripheral areas 31 where the dispersed area $61_k$ is formed includes more voids than the internal electrode layer 2 does, and a part 5a of the external electrodes 5 infiltrates into a part of the peripheral area 31. As the part 5a of the external electrodes 5 is caused to infiltrate into the dispersed area $61_k$, such a structure is formed that can be likened to piles that are driven into the stack 4 through the side face 4a thereof, thereby significantly increasing the bonding strength between the external electrodes 5 and the stack 4 through a so-called anchoring effect. As a result, the external electrodes 5 can be prevented from peeling off the side face 4a of the stack 4, even when the multi-layer piezoelectric element is continuously operated over a long time under a high electric field and a high pressure.

The multi-layer piezoelectric element of the prior art has such a problem that, when continuously operated over a long time under a high electric field and a high pressure, stress generated in the junction between the side face of the stack and the external electrode causes a part of the external electrodes to peel off the side face of the stack, thus resulting in failure of voltage supply to some of the piezoelectric layers leading to a change in the displacement characteristic during the operation. The multi-layer piezoelectric element of the seventh embodiment has high durability since the external electrodes 5 can be suppressed from peeling off the side face of the stack, even when the multi-layer piezoelectric element is continuously operated over a long time under a high electric field and a high pressure.

The number of voids may be compared between the dispersed area $61_k$ and the internal electrode layer $2_k$ by, for example, using a scanning electron microscope (SEM), metallurgical microscope, optical microscope or the like to observe a cross section of the internal electrode layer $2_k$ and a cross section (a section parallel to the stacking direction or a section perpendicular to the stacking direction) of the dispersed area $61_k$, and comparing the images of the sections obtained thereby. If the images of the sections show a significant difference in the number of voids in the internal electrode layer $2_k$ and in the dispersed area $61_k$, then comparison may be carried out visually. If no significant difference is recognized in the number of voids in the internal electrode layer $2_k$ and the dispersed area $61_k$, the void ratio measured by a method to be described later may be compared.

In the multi-layer piezoelectric element of this embodiment, the dispersed area $61_k$ has a higher void ratio than that of the internal electrode layer $2_k$. Void ratio of the dispersed area $61_k$ refers to the proportion (%) of the area occupied by the voids existing in the section of the dispersed area $61_k$ to the total area of the dispersed area $61_k$ in the section (a section perpendicular or a section parallel to the stacking direction) of the stack 4. Void ratio of the internal electrode layer $2_k$ refers to the proportion (%) of the area occupied by the voids existing in the section of the internal electrode layer $2_k$ to the total area of the internal electrode layer $2_k$ in the section of the stack 4. Methods for measuring the void ratio are classified roughly into the following two methods. First is a method of observing the stack 4 in a section thereof parallel to the stacking direction, and the second is a method of observing the stack 4 in a section thereof perpendicular to the stacking direction.

Measurement of the void ratio of the dispersed area $61_k$ and void ratio of the internal electrode layer $2_k$ by the first method may be carried out as follows. First, the stack 4 is polished by a known polishing means so as to reveal a section parallel to the stacking direction. The polishing operation may be done, for example, by using a desktop polishing machine KEMET-V-300 manufactured by KEMET Japan Inc. and a diamond paste. The void ratio of the dispersed area $61_k$ and void ratio of the internal electrode layer $2_k$ may be measured by observing the section exposed by this polishing operation, under a scanning electron microscope (SEM), metallurgical microscope, optical microscope or the like and processing an image of the section taken in this observation. Specifically, on an image of the dispersed area $61_k$ or the internal electrode layer $2_k$ obtained by using an optical microscope, the portions representing the voids are painted in black and the rest is painted in white, then the void ratio can be calculated as (Area of black portions)/(Area of black portions+area of white portions) and represented as a percentage. For example, when the section image is color, the colors may be converted to gray scale values so as to divide the section into black portions and white portions. If it is required to set a threshold that separates two tones of black and white, the threshold may be set by means of image processing software or by visual inspection.

Measurement of the void ratio of the dispersed area $61_k$ and void ratio of the internal electrode layer $2_k$ by the second method may be carried out as follows. First, the stack 4 is polished in the stacking direction by a known polishing means so as to reveal a section of the internal electrode layer $2_k$ or a section of the dispersed area $61_k$ (a section perpendicular to the stacking direction) in which the void ratio is to be measured. The polishing operation may be done, for example, by using a desktop polishing machine KEMET-V-300 manufactured by KEMET Japan Inc. and a diamond paste. The void ratio of the dispersed area $61_k$ or the void ratio of the internal electrode layer $2_k$ may be measured by observing the section exposed by this polishing operation, under a scanning electron microscope (SEM), metallurgical microscope, optical microscope or the like and processing an image of the section taken in this observation. Specifically, on an image of the dispersed area $61_k$ or the internal electrode layer $2_k$ obtained by using an optical microscope, the portions representing the voids are painted in black and the rest is painted in white, then the void ratio can be calculated as (Area of black portions)/(Area of black portions+area of white portions) and represented as a percentage. When the section image is color, the colors may be converted to gray scale values so as to divide the section into black portions and white portions. If it is required to set a threshold that separates two tones of black and white, the threshold may be set by means of image processing software or by visual inspection. When observing the section of the internal electrode layer $2_k$ or the dispersed area $61_k$ it is preferable to observe the section exposed by polishing the layer to a position about one half the thickness thereof. When the internal electrode layer $2_k$ or the dispersed area $61_k$ is thin and there is relatively large variability in the thickness, the entire section of the internal electrode layer $2_k$ or the dispersed area $61_k$ may not be exposed by polishing. In such a case, such an operation may be repeated as the dispersed area $61_k$ or the internal electrode layer $2_k$ is polished until a part of the section is exposed so as to obtain an image of the exposed portion, and polishing further so as to observe the other portion. The partial images obtained in the series of these operations may be added up so as to obtain information on the entire section of the internal electrode layer $2_k$ or the dispersed area $61_k$.

The dispersed area $61_k$ provides insulation between the internal electrode layer $2_k$ that is disposed via the dispersed area $61_k$ and the part 5a of the external electrode 5. This enables connection of the plurality of internal electrode layers 2 alternately to the external electrodes 5. While the internal electrode layers 2 and the external electrodes 5 may be insulated from each other by various methods, the dispersed area $61_k$ in this embodiment includes a plurality of metallic regions 3 dispersed in the state of being insulated from the internal electrode layer $2_k$. Since the dispersed area $61_k$ where the internal electrode layer 2 is not formed partially bonds the two piezoelectric layers $1_k$ that are located adjacently in the stacking direction by means of a plurality of inorganic material regions (metallic regions 3 in this embodiment), the internal electrode layer $2_k$ and the external electrodes 5 can be insulated from each other. Also because the restrictive force of the undisplaceable portion that restricts the displacement of the displacement portion can be made lower than in the case where the piezoelectric layers that are located adjacently in the stacking direction are firmly bonded with each other over the entire surface as in the case of the peripheral area of the prior art, a device capable of making a large amount of displacement can be obtained.

Since the dispersed area $61_k$ has such a structure as a plurality of the metallic regions 3 are dispersed via the voids 41, the part 5a of the external electrode 5 can infiltrate into the dispersed area $61_k$ for the following reasons. As will be described later in relation to the manufacturing method, when the electrically conductive paste is applied and baked on the side faces of the stack 4 to form the external electrodes 5, the electrically conductive paste heated to the softening temperature thereof or higher can easily infiltrate between the plurality of dispersed metallic regions 3 that constitute the dispersed area $61_k$ by a capillary effect. As a result, a part of the external electrode 5 can be caused to effectively infiltrate into the dispersed area $61_k$. Thus the external electrodes 5 can be firmly bonded to the side face 4a of the stack 4, so as to exhibit high durability even when the device is continuously operated over a long time under a high electric field and a high pressure.

The depth D to which the part 5a of the external electrode 5 infiltrates into the dispersed area $61_k$ through the side face 4a of the stack 4 is 1 μm or more, preferably 5pm or more. When depth D is less than 1 μm, a sufficient anchoring effect cannot be obtained and insufficient bonding strength between the external electrodes 5 and the side face of the stack 4 cannot be obtained. There is no upper limit for the depth D as long as the part 5a of the external electrode 5 is electrically insulated from the internal electrode layer 2.

The size (width in the direction perpendicular to the stacking direction) of the metallic region 3 that constitutes the dispersed area $61_k$ is preferably in a range from 1 to 100 μm. When the metallic region 3 is smaller than 1 μm, the dispersed area $61_k$ becomes too thin and it becomes difficult for the part 5a of the external electrode 5 to infiltrate into the dispersed area $61_k$. When the metallic region 3 is larger than 100 μm, the effect of absorbing the stress generated by the shrinkage and expansion of the stack 4 and distributing the stress in the dispersed area $61_k$ is weakened and the stress may concentrate in a particular metallic region 3. By controlling the size of the metallic regions 3 dispersed in the dispersed area $61_k$ within the range from 1 to 100 μm, it is made possible to cause the part 5a of the external electrode 5 to effectively infiltrate into a part of the dispersed area $61_k$, and cause the dispersed area $61_k$ to effectively distribute and absorb the stress generated by the shrinkage and expansion of the stack 4. The size of the metallic region 3 is more preferably in a range from 3 to 50 μm. There is no restriction on the shape of the metallic regions 3 which may be a cylindrical shape, a substantially spherical shape or the like.

The dispersed area $61_k$ of this embodiment has such a structure as a plurality of metallic regions 3 that constitute the dispersed area $61_k$ are dispersed via the voids 41. As the plurality of metallic regions 3 that constitute the dispersed area $61_k$ are dispersed via the voids 41, it is made easy to make the void ratio of the dispersed area $61_k$ higher than that of the internal electrode layer $2_k$. By making the void ratio of the dispersed area $61_k$ higher than that of the internal electrode layer $2_k$, the part 5a of the external electrode 5 can be caused to infiltrate deep into the dispersed area $61_k$ that includes more voids during the process of forming the external electrode's 5, thus effectively improving the bonding strength between the external electrodes 5 and the stack 4.

The void ratio in the dispersed area $61_k$ is preferably in a range from 45 to 99.9%, and more preferably from 80 to 99.9%, in order to cause the part 5a of the external electrode 5 to effectively infiltrate into a part of the voids 41 during the process of forming the external electrodes 5. When the void ratio is set within the range described above, the part 5a of the external electrode 5 can effectively infiltrate deep into the dispersed area $61_k$ so as to achieve the anchoring effect, and achieve the effect of reducing the restrictive force of restricting the displacement of the stack 4 during displacement. When the void ratio is lower than 45%, it may become difficult for the part 5a of the external electrode 5 to infiltrate into the dispersed area $61_k$. When the void ratio is higher than 99.9%, the amount of the metallic regions 3 in the dispersed area $61_k$ becomes small, causing peel-off in the dispersed area $61_k$ between the piezoelectric layers 1, 1 during firing to easily occur.

It is preferable that the part 5a of the external electrode 5 infiltrates between the plurality of metallic regions 3 dispersed in the dispersed area $61_k$ as shown in FIG. 10. By causing the part 5a of the external electrode to infiltrate between the plurality of metallic regions 3 in the dispersed area $61_k$, it is made possible to enhance the anchoring effect of the external electrode 5 in the side face 4a of the stack 4 and greatly increase the bonding strength.

Figure 11:
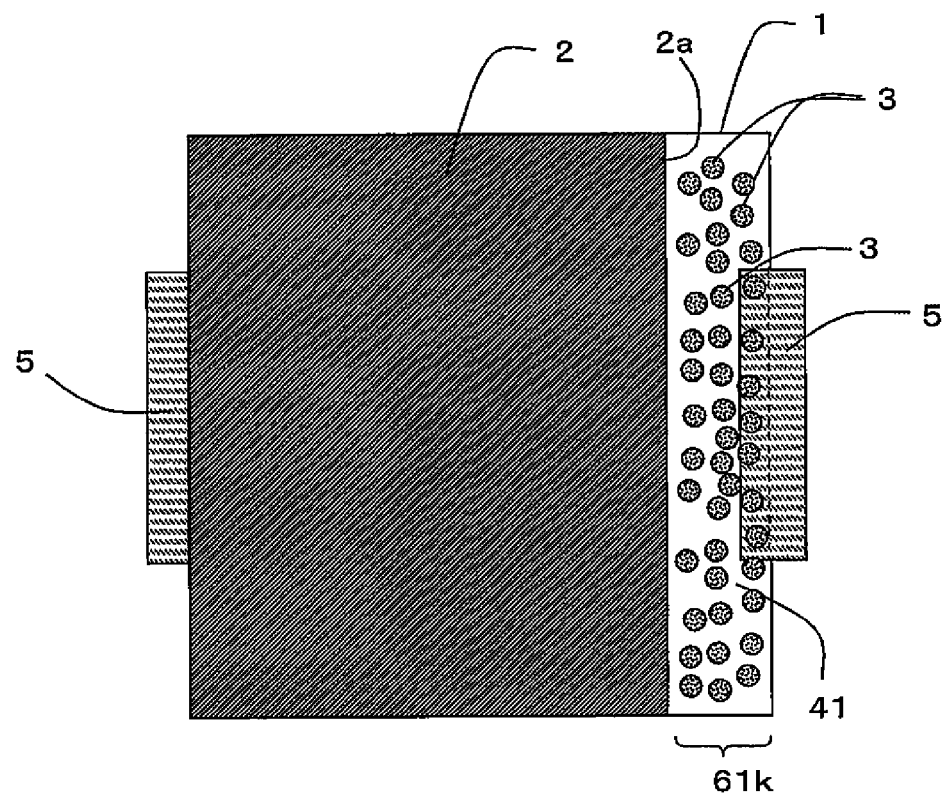
FIG. 11 is a sectional view of the multi-layer piezoelectric element of the seventh embodiment in a section that is perpendicular to the stacking direction and includes the internal electrode layer and the peripheral area.

FIG. 11 is a sectional view of the multi-layer piezoelectric element of this embodiment in a section that is perpendicular to the stacking direction and includes the internal electrode layer $2_k$ and the dispersed area $61_k$. As shown in FIG. 11, the dispersed area $61_k$ is constituted from a plurality of metallic regions 3 dispersed in the state of being insulated from the internal electrode layer $2_k$. The plurality of metallic regions 3 that constitute the dispersed area $61_k$ are dispersed via the voids 41. Since the voids 41 communicate from the edge 2a of the internal electrode layer $2_k$ to the part 5a of the external electrode 5, the force that restricts the piezoelectric layers 1, 1 that are disposed adjacently in the stacking direction of the dispersed area $61_k$ can be effectively reduced, so that the amount of displacement of the device can be further increased.

It is preferable that there are a plurality of the peripheral areas 31, that include the dispersed areas $61_k$ into which the part 5a of the external electrode 5 infiltrates, disposed in the stacking direction of the stack 4. This further enhances the effect of increasing the amount of displacement of the multi-layer piezoelectric element, and further increases the bonding strength of the external electrode 5. It is also preferable that a plurality of the peripheral areas 31, where the part 5a of the external electrode 5 infiltrates, are disposed in an ordered arrangement in the stacking direction. With such a constitution where the peripheral areas 31 in which the external electrode 5 infiltrates are disposed in an ordered arrangement in the stacking direction, the external electrodes 5 are bonded firmly and substantially uniformly over the entire length in the stacking direction of the stack 4.

It is preferable that the plurality of the peripheral areas 31, where the part Sa of the external electrode 5 infiltrates, are provided in a ratio of one for every group of internal electrode layers 2 not more than one half the total number of the internal electrode layers 2, more preferably one for every group of the internal electrode layer 2 not more than one eighth of the total number of the internal electrode layers 2, and most preferably one for every group of the internal electrode layer 2 not less than one fifteenth of the total number of the internal electrode layers 2. When the peripheral areas 31 where the part 5a of the external electrode 5 infiltrate are provided in a ratio of one for every group of more internal electrode layer 2 than one half the total number of the internal electrode layers 2, the small proportion of the portions where the part of the external electrode 5 infiltrates into the stack 4 may result in uneven bonding strength of the external electrodes 5 over the entire length in the stacking direction.

The phrase the peripheral areas 31, where the part 5a of the external electrode 5 infiltrates are "disposed in an ordered arrangement" means not only the case where the plurality of peripheral areas 31 are disposed at equal intervals, but also the case where the peripheral areas 31 are disposed at similar intervals to such an extent as the external electrodes 5 can be firmly bonded to the side face 4a of the stack 4 substantially uniformly over the entire length in the stacking direction. Specifically, it is preferable that the spacing between the peripheral areas 31, where the part 5a of the external electrode 5 infiltrates, is within ±20%, more preferably ±15% of the mean interval between the peripheral areas 31, and most preferably the intervals are the same.

The peripheral areas 31, where the part 5a of the external electrode 5 infiltrates, can be disposed in an ordered arrangement by, for example, placing the peripheral area 31 for every predetermined number (for example, 20) of the layers. When the total number of the internal electrode layers 2 is not divisible by the predetermined number, the peripheral areas 31 where the part 5a of the external electrode 5 infiltrates may be placed without following the rule of the same intervals near the ends of the stack.

It is also preferable that the peripheral areas 31, where the part 5a of the external electrode 5 infiltrates, are disposed alternately so as to adjoin the pair of external electrodes on the side face of the stack 4 whereon the external electrodes 5 of positive polarity and negative polarity are formed. In this constitution, the external electrode 5 of positive polarity and the external electrode 5 of negative polarity infiltrate evenly into the peripheral areas 31, so that the external electrodes 5 of positive polarity and negative polarity are firmly bonded onto the stack 4 in a well-balanced manner.

When only the performance is emphasized, it is preferable that the peripheral areas 31, where the part 5a of the external electrode 5 infiltrates, are disposed between all of the piezoelectric layers 1, 1. With this configuration, the external electrodes 5 can be firmly bonded on the side faces of the stack 4 over the entire length in the stacking direction, and therefore such problems as peel-off of the external electrodes 5 from the side face of the stack 4 and decrease in the amount of displacement during operation can be prevented from occurring more reliably, even when the device is continuously operated at a high speed under a high electric field. When the peripheral areas 31 are disposed in an orderly arrangement as described above not between all of the piezoelectric layers, requirements for the performance and the manufacturing cost can be met in a well-balanced manner.

While the inorganic material in the peripheral areas 31 is the metallic regions 3 in the multi-layer piezoelectric element of this embodiment, the inorganic material may be a metallic material, a piezoelectric material or a combination of a metallic material and a piezoelectric material. When the inorganic material is a metallic material, the metallic material can deform so as to distribute the stress when the device undergoes a large amount of displacement under a high electric field, since the metallic material has a lower Young's modulus than that of the piezoelectric layer 1. As a result, the piezoelectric layer 1 can be suppressed from cracking. Also because the metallic material can easily deform, the force of the peripheral area $31_k$ to restrict the displacement of the stack 4 can be further decreased, so that a larger amount of displacement can be achieved.

It is also preferable that main component of the metallic material that constitutes the inorganic material is preferably at least one kind selected from among the metals of groups 8 through 11 of the periodic table. Using the metallic material constituted mainly from such makes it possible to fire the piezoelectric layers 1 and the peripheral area $31_k$ at the same time, so as to firmly bond the piezoelectric layers 1 and the metallic region 3. Even when the peripheral area $31_k$ receives a stress generated by the displacement of the device, the stress would not be concentrated since the peripheral area $31_k$ is formed from a metal that is pliant enough to expand and contract, thus making it possible to provide a multi-layer piezoelectric element having high durability. It is particularly preferable that the metal element that constitutes the peripheral area $31_k$ is an alloy consisting of at least one kind selected from among Ni, Pt, Pd, Rh, Ir, Ru and Os, which are metals of groups 8 through 10 of the periodic table, and at least one kind selected from among Cu, Ag and Au, which are metals of group 11 of the periodic table, or an alloy of these metal elements. This is because such a metal composition is advantageous in volume production when the alloy powder synthesizing technology available today is employed.

When the internal electrode layer 2 is formed from an alloy such as a silver-palladium alloy constituted from at least one kind selected from among Ni, Pt, Pd, Rh, Ir, Ru and Os, which are metals of groups 8 through 10 of the periodic table, and at least one kind selected from among Cu, Ag and Au, which are metals of group 11 of the periodic table, it is preferable to form the metallic region 3 from a metal of group 11 of the periodic table or an alloy that includes a metal of group 11 of the periodic table, and set the proportion of the metal of group 11 of the periodic table in the metallic region 3 higher than the proportion of the metal of group 11 of the periodic table in the metallic material that forms the internal electrode layer $2_k$. Such a constitution enables making the Young's modulus of the peripheral area $31_k$ lower than that of the internal electrode layer $2_k$, so that the peripheral area $31_k$ can effectively absorb the stress generated by the contraction and expansion of the stack 4. As a result, since the stress generated in the external electrodes 5 by the contraction and expansion of the stack 4 can be reduced, such trouble as the part 5a of the external electrode 5 peeling off the side face 4a of the stack 4 can be prevented from occurring.

When the inorganic material is a piezoelectric material, since the piezoelectric material that constitutes the peripheral area $31_k$ can be easily deformed by pressure during operation under a high pressure, pressure is not concentrated at a point and high stress can be prevented from being generated in the piezoelectric layer 1 that adjoins the peripheral area $31_k$.

When the inorganic material consists of a metallic material and a piezoelectric material, the two effects described above prevent the device from breaking even when the device is continuously operated under a high electric field and a high pressure, and a multi-layer piezoelectric element that combines the above-mentioned two effects is obtained.

When the inorganic material includes a metallic material, it is preferable that the main component of the metallic material is the same as the main component of the internal electrode layer 2. This makes it possible to fire the piezoelectric layers 1, the internal electrode layers 2 and the peripheral area 31k at the same time, so as to provide a multi-layer piezoelectric element at a low cost.

When the inorganic material includes a piezoelectric material, it is preferable that the piezoelectric material that constitutes the inorganic material has the same composition as that of the piezoelectric material that constitutes the piezoelectric layer 1. Use of a piezoelectric material having the same composition to form the inorganic material and the piezoelectric layer 1 makes it possible to fire the piezoelectric layers 1 and the peripheral area $31_k$ at the same time. It also prevents the composition of the piezoelectric material that constitutes the piezoelectric layer 1 from changing even when the components of both materials diffuse into each other during firing, thus making it possible to obtain a multi-layer piezoelectric element having the desired piezoelectric characteristic.

When the inorganic material includes a metallic material, it is preferable that the main component of the metallic material is the same as the main component of the external electrode 5. When the main component of the metallic material that constitutes the metallic region 3 is the same as the main component of the external electrode 5, the main components of both materials diffuse into each other in the portion bonding the inorganic material and the external electrode 5 when the paste is applied to the side face 4a of the stack 4 to form the external electrode 5, so as to form a firm bonding between the metallic region 3 of the peripheral area $31_k$ and the external electrode 5 through the diffusion bonding, thus further increasing the bonding strength of the external electrode 5 onto the side face of the stack 4. The diffusion bonding between the inorganic material and the external electrode 5 results in the formation of a mutual solution region of the inorganic material and the external electrode 5. In this case, the depth D to which the part 5a of the external electrode 5 infiltrates into the dispersed area $61_k$ through the side face 4a of the stack 4 refers to the distance from the side face 4a of the stack 4 to the border between the mutual solution region and the inorganic material-only region.

In this embodiment, the border between the internal electrode layer $2_k$ and the peripheral area 31 that has the dispersed area $61_k$ where the metallic regions 3 are dispersed can be identified by comparing the number of voids represented by the void ratio. When the internal electrode layer $2_k$ and the metallic region 3 included in the dispersed area $61_k$ are formed from the same metallic material, however, the border between the internal electrode layer $2_k$ and the dispersed area $61_k$ may be difficult to recognize. In such a case, the border between the internal electrode layer $2_k$ and the dispersed area $61_k$ can be approximately determined by a method as described below. In the peripheral area 31 located between the piezoelectric layers $1_{k+1}$, $1_{k+2}$ where the metallic regions 3 are not dispersed, the piezoelectric material fills the region between the edge 2a of the internal electrode layer $2_{k+2}$ and the side face 4a of the stack 4. Therefore, the border between the internal electrode layer $2_{k+2}$ and the peripheral area 31 where the metallic regions 3 are not dispersed can be easily recognized. The internal electrode layers 2 are usually disposed so that projections thereof in the stacking direction overlap each other in every other layer. Therefore, when it is difficult to identify the border between the internal electrode layer $2_k$ and the dispersed area $61_k$, the border between the internal electrode layer $2_{k+2}$ and the peripheral area 31 may be taken as roughly representing the border between the internal electrode layer $2_k$ and the dispersed area $61_k$.

Now a method of manufacturing the multi-layer piezoelectric element of the seventh embodiment will be described. First, a calcined powder of a piezoelectric ceramic material constituted from a perovskite type oxide consisting of PZT or the like, a binder made of an organic polymer such as acrylic resin or butyral resin and a plasticizer such as DBP (dibutyl phthalate) or DOP (dioctyl phthalate) are mixed to form a slurry. The slurry is formed into ceramic green sheets that will become the piezoelectric layers 1 by a known method such as a doctor blade process or a calender roll process or another tape molding method.

Then a metal powder such as silver-palladium that would form the internal electrode layer 2, a binder and a plasticizer are mixed, with the calcined powder of the above-mentioned piezoelectric ceramic material added as required, to prepare an electrically conductive paste which will be used to form the internal electrode layer 2, and is applied onto the top surfaces of the ceramic green sheets by a screen printing method or the like to a thickness of 1 to 40 μm.

Then a dispersed area paste is printed for the purpose of forming a dispersed plurality of inorganic material pieces in the peripheral area 31 of the internal electrode layer 2. The dispersed area paste is prepared by mixing a powder of an inorganic material consisting of at least one of a metal of groups 8 through 11 of the periodic table such as silver and a piezoelectric material, and a binder, a plasticizer and an organic material such as acrylic beads that will solidify when dried and evaporate when fired. As the dispersed area paste includes the organic material such as acrylic beads that will solidify when dried and evaporate when fired, it is made possible to form the dispersed area $61_k$ that has the desired void ratio and is constituted from the dispersed inorganic material. The void ratio of the peripheral area can be adjusted by controlling the quantity of the acrylic beads added to the dispersed area paste. The void ratio becomes low when the quantity of the acrylic beads is small, and becomes high when the quantity of the acrylic beads is large. The powder of the piezoelectric material used in the dispersed area paste is preferably a calcined powder of the piezoelectric ceramic material having the same composition as the piezoelectric material.

Then the green sheets having the electrically conductive paste for the internal electrode layer 2 printed on the top surface thereof and the green sheets having the electrically conductive paste for the internal electrode layer 2 and the dispersed area paste printed thereon are stacked one on another in a predetermined order so as to obtain a stack compact, with the stack compact being heated at a predetermined temperature to remove the binder. The stack compact is then fired at a temperature in a range from 900 to 1,200° C. thereby to make the stack (sintered stack).

The green sheets having the dispersed area paste printed thereon are stacked on the portions of the piezoelectric layer 1 where it is desired to form the dispersed area $61_k$ comprising the metallic regions 3 dispersed via the voids 41. Thus the dispersed area $61_k$ can be formed at the desired position with the metallic regions 3 dispersed via the voids 41. When it is desired to form the peripheral areas 31 that have the above-mentioned regions dispersed therein between all of the piezoelectric layers, the electrically conductive paste and the dispersed area paste may be printed on all the green sheets, which are then stacked one on another.

If a metal powder such as silver-palladium that constitutes the internal electrode layer 2 is added to the green sheet that forms the inactive layer 9, or if a paste comprising the metal powder such as silver-palladium that constitutes the internal electrode layer 2, an inorganic compound, a binder and a plasticizer is printed on the green sheets, shrinking behavior and shrinking rate can be matched between the inactive layer 9 and the other portions during sintering, and therefore it is made possible to form a dense stack 4.

The method of making the stack 4 is not limited to that described above, and any manufacturing method may be employed as long as the stack 4 can be made in such a constitution as a plurality of the piezoelectric layers 1 and a plurality of the internal electrode layers 2 are stacked alternately one on another.

The stack is then ground into a predetermined shape by using known equipment such as a planar grinding machine. Then an electrically conductive silver-glass paste, prepared by mixing an electrically conductive powder that includes silver as the main component, glass powder, a binder, a plasticizer and a solvent, is printed by screen printing or another method onto the side faces 4a of the stack 4 whereon the external electrodes 5 are to be formed. The stack is then dried and fired at predetermined temperatures so as to form the external electrodes S. The glass component is preferably a glass which includes at least one of lead oxide and silicon oxide and has a softening point not higher than 800° C., in order to obtain a high strength of bonding with the piezoelectric layer 1 and cause effective infiltration into the dispersed area $61_k$. Besides such a glass, the glass component may be silica glass, soda-lime glass, lead alkali silicate glass, aluminoborosilicate glass, borosilicate glass, aluminosilicate glass, borate glass, phosphate glass, lead glass or the like.

The borosilicate glass, for example, may include 40 to 70% by weight of $SiO_2$, 2 to 30% by weight of $B_2O_3$, 0 to 20% by weight of $Al_2O_3$, 0 to 10% by weight in total of oxides of alkali earth metals such as MgO, CaO, SrO and BaO, and 0 to 10% by weight of oxides of alkali metals. The borosilicate glass described above may also include 5 to 30% by weight of ZnO. ZnO has an effect of lowering the processing temperature of borosilicate glass.

Phosphate glass may include 40 to 80% by weight of $P_2O_5$, 0 to 30% by weight of $Al_2O_3$, 0 to 30% by weight of $B_2O_3$, 0 to 30% by weight of ZnO, 0 to 30% by weight of oxides of alkali earth metals and 0 to 10% by weight of oxides of alkali metals.

The lead glass may include 30 to 80% by weight of PbO, 0 to 70% by weight of $S1O_2$, 0 to 30% by weight of $Bi_2O_3$, 0 to 20% by weight of $Al_2O_3$, 0 to 30% by weight of ZnO, 0 to 30% by weight of oxides of alkali earth metals and 0 to 10% by weight of oxides of alkali metals.

The electrically conductive material used to form the external electrodes 5 preferably includes silver as the main component, in order to have resistance to oxidation and a low Young's modulus and to be low in cost. A trace of platinum or palladium may be added for the purpose of improving resistance to electro-migration.

The temperature, at which the electrically conductive silver-glass, paste is bonded by baking, is preferably not lower than the softening point of the glass component included in the electrically conductive silver-glass paste and in a range from 500 to 800° C. for the purpose of causing the part 5a of the external electrode 5 to infiltrate into the peripheral area $31_k$ and increase the bonding strength between the external electrodes 5 and the side face 4a of the stack 4. The softening point of the glass component included in the electrically conductive silver-glass paste is preferably in a range from 500 to 800° C.

An electrical conductivity assisting member, formed from an electrically conductive adhesive, including a metal mesh or a mesh-like metal sheet embedded therein, may be formed on the external surface of the external electrode 5. Providing the electrical conductivity assisting member on the external surface of the external electrode 5 makes it possible to supply a large current flowing through the electrical conductivity assisting member so as to decrease the current flowing in the external electrodes 5 when the actuator is driven by a large current to operate the device at a high speed. As a result, local heating which may lead to breakage of the external electrode 5 can be prevented from occurring, thereby significantly improving the durability. The metal mesh or mesh-like metal sheet embedded in the electrically conductive adhesive also prevents cracks from occurring in the electrically conductive adhesive. The metal mesh refers to a structure of entwined metal wires, and the mesh-like metal sheet refers to a metal sheet with a number of holes punched therethrough.

It is further preferable that the electrically conductive adhesive that constitutes the electrical conductivity assisting member is a polyimide resin including silver powder dispersed therein as electrically conductive particles. Use of a polyimide resin that has high heat resistance and includes silver powder which has low resistivity dispersed therein makes it possible to form an electrical conductivity assisting member which maintains low resistivity and high bonding strength even when used at a high temperature.

The electrically conductive particles are preferably non-spherical particles having such shapes as flakes or acicular particles. When the electrically conductive particles are non-spherical particles such as flakes or acicular particles, the electrically conductive particles can be firmly entwined with each other, thereby increasing the shear strength of the electrically conductive adhesive.

Then the side face 4a of the stack 4 including the external electrodes 5 is coated with a coating resin made of silicone rubber or the like by dipping or another process. Then the multi-layer piezoelectric element of the present invention is completed by connecting the lead wires 6 to the external electrodes 5 by soldering or the like.

The multi-layer piezoelectric element of the present invention is not limited to those described above, and various modifications may be made within the scope of the present invention. While the embodiments described above deal with cases where the external electrodes 5 are formed on the opposing side faces of the stack 4, a pair of the external electrodes 5 may also be formed on side faces which adjoin each other, for example, according to the present invention.

Injection Apparatus

Figure 12:
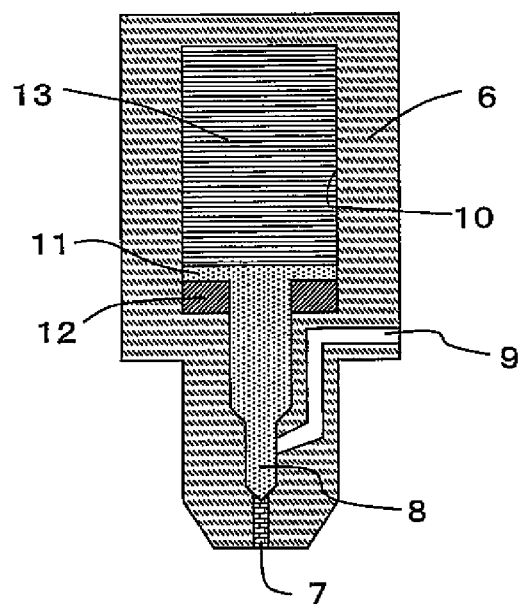
FIG. 12 is a sectional view of an injection apparatus according to one embodiment of the present invention.

FIG. 12 is a sectional view of an injection apparatus according to one embodiment of the present invention. As shown in FIG. 12, the injection apparatus has a container 6 having an injection hole 7, with a piezoelectric actuator 13 comprising the multi-layer piezoelectric element of the present invention housed in the container 6. The injection apparatus is constituted so that a liquid fuel held in the container 6 is ejected through the injection hole 7 by the operation of the piezoelectric actuator 13. A needle valve 8 that can open and close the injection hole 7 is housed in the container 6. The injection hole 7 is connected to a fuel passage 9 disposed so as to be capable of making communication therewith. The fuel passage 9 is connected to a fuel source that is provided outside of the apparatus, so as to receive supply of the fuel at a high pressure that remains always constant. When the needle valve 8 opens the injection hole 7, the fuel that fills the fuel passage 9 is injected at a predetermined level of high pressure into a fuel chamber of an internal combustion engine that is not shown in the drawings. The needle valve 8 has an enlarged top portion of a larger diameter so as to provide a piston 11 that makes a sliding motion in a cylinder 10 that is formed in the container 6. The piezoelectric actuator 13 described above is housed in the container 6.

With the injection apparatus as described above, when the piezoelectric actuator 13 is caused to expand by a voltage applied thereto, the piston 11 is pressed so that the needle valve 8 plugs the injection hole 7 and shuts off the fuel supply. When the voltage is removed, the piezoelectric actuator 13 contracts and a Belleville spring 12 presses back the piston 11 so that the injection hole 7 communicates with the fuel passage 9 thereby allowing the fuel to be ejected.

The multi-layer piezoelectric element and the injection apparatus of the present invention have been described, although the present invention is not limited to the embodiments described above. For example, although the portion where the internal electrode layer is not formed is provided in the form of a band at the end of the piezoelectric layer in the embodiments, the present invention is not limited to this constitution. For example, the portion where the internal electrode layer is not formed may be provided at the corners of the piezoelectric layer.

In the embodiments described above, the regions are metallic regions or voids. However, the regions may be formed from a different material that can deform more easily than the piezoelectric ceramics that constitutes the piezoelectric layer. As a material that can deform more easily than the piezoelectric ceramics, in addition to solid materials such as various ceramics, various plastics or rubber, materials in a liquid or gel state may also be used. When a material having a heat insulation temperature not higher than the firing temperature of the stack is used among these materials, the following manufacturing method may be employed. For example, instead of firing the stack as a whole, the regions formed from the above-mentioned material may be dispersed among a plurality of stacks that have been made in advance, with the stacks then bonded together. This method makes it possible to reduce the restrictive force of the undisplaceable portion that restricts the displacement of the displacement portion and suppress the strength against breakage and insulation performance from deteriorating, so that high reliability and high displacement performance can be achieved at the same time.

Also according to the present invention, such a constitution may be employed as a plurality of regions formed from ceramics are dispersed in the peripheral area and there are voids between the ceramic regions. The ceramic material may be the same material as the piezoelectric layer, or may be a different ceramic material. This constitution makes it possible to reduce the restrictive force of the undisplaceable portion that restricts the displacement of the displacement portion and suppress the strength against breakage and insulation performance from deteriorating, so that high reliability and high displacement performance can be achieved at the same time.

The multi-layer piezoelectric element of the present invention can be applied to various applications as, for example, a fuel injection apparatus of an automobile engine; a liquid injection apparatus of an ink jet printer or the like; a drive unit for a precision positioning device; a vibration preventing device for an optical apparatus; a sensor element mounted in a combustion pressure sensor, a knocking sensor, an acceleration sensor, a load sensor, an ultrasound sensor, a pressure sensor, a yaw rate sensor or the like; and circuit component mounted in a piezoelectric gyro, a piezoelectric switch, a piezoelectric transducer, a piezoelectric breaker or the like, and any other devices that utilize a piezoelectric property, without departing from the scope of the present invention.

Example 1

Now Examples of the present invention will be described in detail. A piezoelectric actuator comprising the multi-layer piezoelectric element of the present invention was fabricated as described below. First, a calcined powder of a piezoelectric ceramic material constituted from lead zirconate titanate (PZT) having mean particle size of 0.4 μm as the main component, a binder and a plasticizer were mixed to form a slurry, which was formed into ceramic green sheets that would become the piezoelectric layer 1 having a post-firing thickness of about 150 μm by a doctor blade process.

An electrically conductive paste, prepared by adding a binder to a silver-palladium alloy (95% by weight of silver and 5% by weight of palladium), was applied to one side of the ceramic green sheet by a screen printing method. Then the ceramic green sheets were stacked one on another and fired by holding the temperature at 800° C. then raising the temperature to 1,000° C. to obtain a fired stack. Thus the stacks having the structures shown in FIGS. 2 through 7 and FIG. 14 were obtained.

The multi-layer piezoelectric element having the structure shown in FIG. 4 was made by printing a pattern of the metallic region 3 by using a screen printing plate having a mask pattern so as to form the peripheral areas having a plurality of metallic regions 3 dispersed therein (island-like metallic regions 3 were formed by screen printing). The metallic regions 3 were formed from a silver-palladium alloy, and a paste including this metal was applied by a screen printing method.

The multi-layer piezoelectric element having the structure shown in FIG. 5 was made by printing a binder in portions other than the island-like metallic regions 3 to provide masking, so that the voids 41 would be formed after firing.

The multi-layer piezoelectric element having the structure shown in FIG. 3 was made by printing a pattern of the metallic region 3 by using a screen printing plate having a mask pattern so as to form the peripheral areas having a plurality of metallic regions 3 dispersed therein, and printing a paste prepared by mixing a coexisting material of PZT and a binder onto portions other than the metallic regions 3. Thus such a structure was made as the metallic regions 3 were dispersed in the peripheral areas, the insulation ceramic regions made of PZT were interposed between the metallic regions 3, and voids were dispersed in the insulation ceramic regions.

Figure 13A:
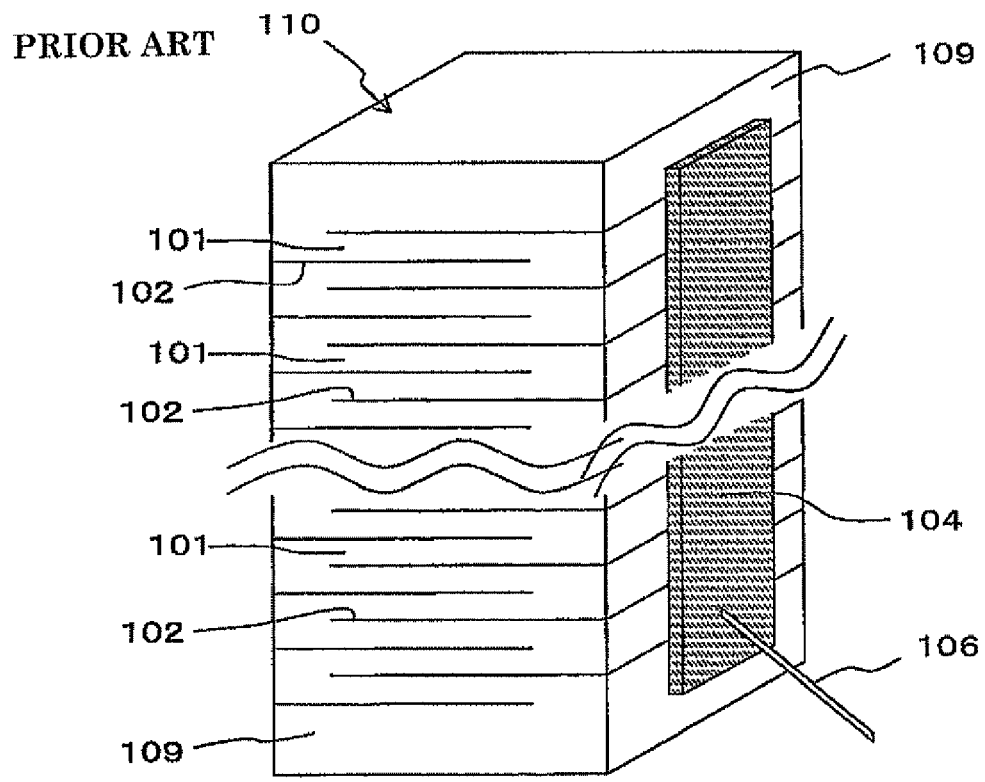
FIG. 13A is a perspective view of a multi-layer piezoelectric element of the prior art.
Figure 13B:
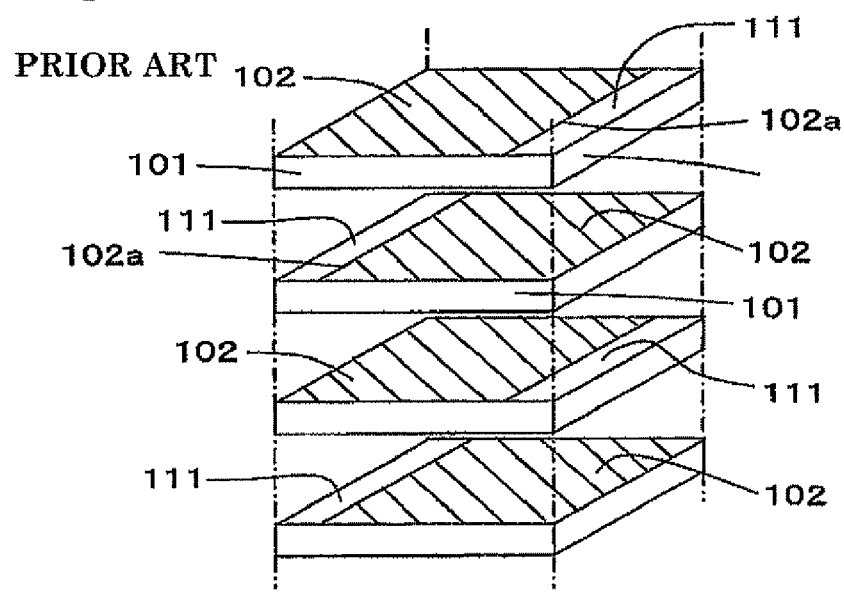
FIG. 13B is a partial perspective view showing the state of the piezoelectric layers and the internal electrode layers being stacked in the multi-layer piezoelectric element shown in FIG. 13A.
Figure 14:
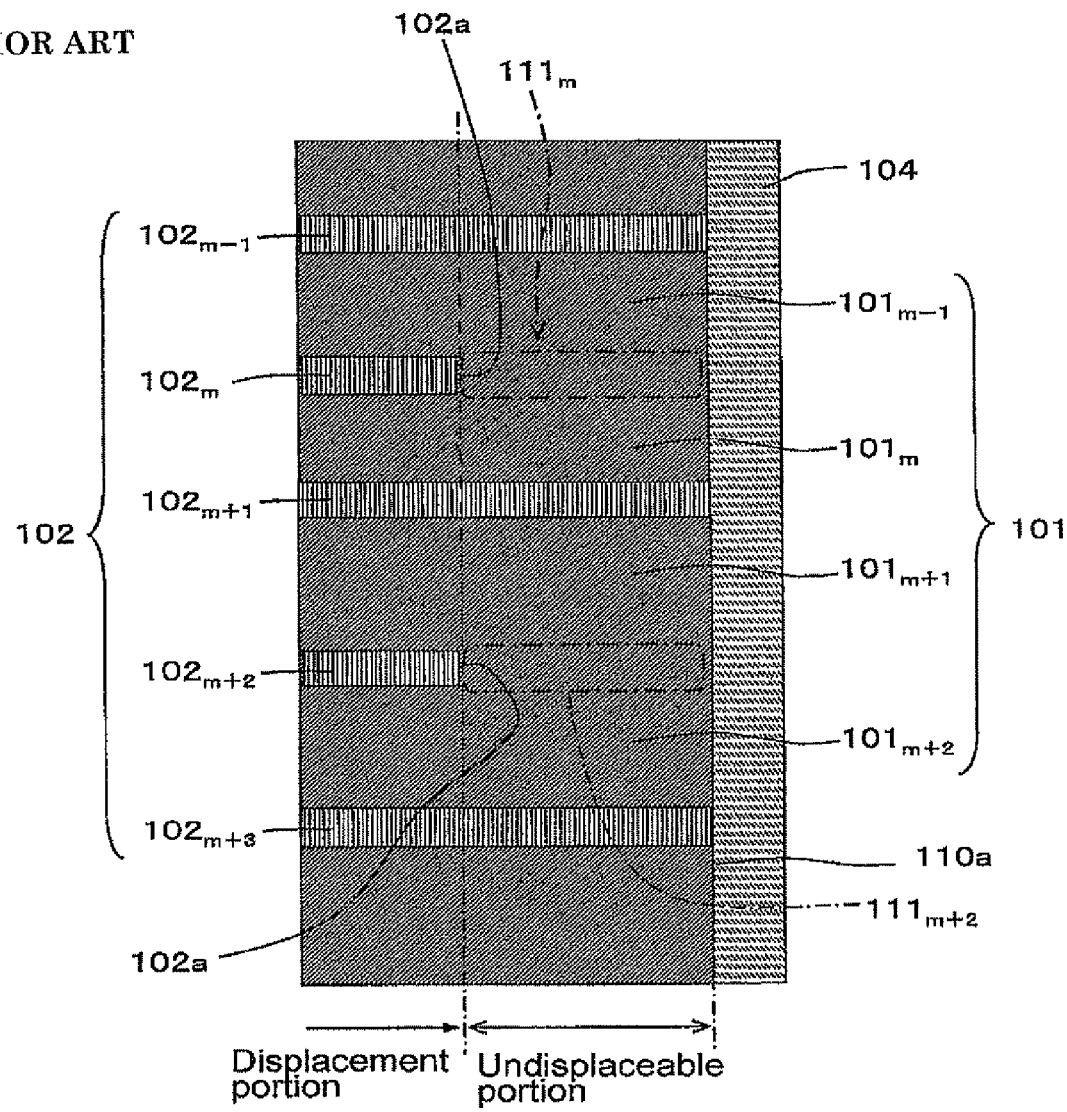
FIG. 14 is a partially enlarged sectional view showing the structure of the piezoelectric layers and the internal electrode layers being stacked in the multi-layer piezoelectric element of the prior art.

A silver-glass paste was printed on the faces of the stack 4 where the external electrodes would be formed and dried, before baking at 700° C. for 30 minutes. Then lead wires were connected to the external electrodes 5, and a DC electric field of 3 kV/mm was applied between the external electrodes 5 of positive and negative polarities via the lead wires so as to apply a polarization treatment for 15 minutes, thereby to complete the multi-layer piezoelectric element as shown in FIG. 1 or FIG. 13.

With a DC voltage of 150 V applied to the multi-layer piezoelectric element obtained as described above, the amount of displacement was measured by using a laser displacement meter. Strength of the stack against breakage was measured by a 4-point loading fracture test. The results of the measurements are shown in Table 1.

TABLE 1

| Sample No. | Constitution of peripheral area | Displacement in initial state (Unit: µm) | Strength against breakage (Unit: N) |
|---|---|---|---|
| 1 | FIG. 14 | 30 | 420 |
| 2 | FIG. 4 | 60 | 425 |
| 3 | FIG. 5 | 70 | 420 |
| 4 | FIG. 3 | 65 | 420 |
| 5 | FIG. 2 | 55 | 430 |
| 6 | FIG. 6 | 55 | 430 |
| 7 | FIG. 7 | 65 | 425 |

As shown in Table 1, sample Nos. 2 through 7 having the metallic regions 3 dispersed therein showed larger amounts of displacement in the initial state without lowering the strength against breakage, than the sample No. 1 that did not have the metallic regions 3 dispersed in the peripheral areas (island-like regions 3 not formed).

Example 2

Multi-layer piezoelectric elements of the seventh embodiment were fabricated as described below. First, a calcined powder of a piezoelectric ceramic material constituted from lead zirconate titanate (PZT) having a mean particle size of 0.4 µm as the main component, a binder and a plasticizer were mixed to form a slurry which was formed into ceramic green sheets that would become the piezoelectric layers 1 having a post-firing thickness of about 150 µm on average by a doctor blade process.

An electrically conductive paste, prepared by adding a binder to a silver-palladium alloy having a mean particle size of 0.8 µm, was applied to one side of the ceramic green sheet by a screen printing method to a mean thickness of 4 µm. The dispersed area paste prepared by mixing an inorganic material, a binder and acrylic beads was printed in a portion where the electrically conductive paste is not applied (peripheral area) by a screen printing method to an average thickness of 4 µm. A silver powder having a mean particle size of 0.8 µm was used as the inorganic material. Acrylic beads having a mean particle size of 0.5 µm were added in a proportion of 200% by volume for 100% by volume of silver powder.

A stack compact was made by stacking the green sheets in proportion of one green sheet having the electrically conductive paste and the dispersed area paste printed thereon for 20 green sheets having only the electrically conductive paste printed thereon. The stack compact was then heated at a temperature in a range from 350 to 450° C. thereby removing the organic materials, followed by firing at a temperature in a range from 980 to 1,100° C. thereby making the fired stack. The fired stack was ground on a planar grinding machine to obtain the stack 4.

To a mixture of silver powder having mean particle size of 2 µm and glass powder having a softening point of 650° C. including silicon having a mean particle size of 2 µm as the main component, a binder was added so as to prepare the electrically conductive silver-glass paste, which was printed onto the side face of the stack 4 where the external electrode 5 was to be formed to a mean thickness of 30 µm by screen printing. The stack compact was then fired at 700° C. for 30 minutes, so as to form the external electrodes 5.

In the peripheral area 31 located between the internal electrode layer 2 and the side face of the stack 4, between the piezoelectric layers having the dispersed area paste printed thereon, such a structure was formed as a plurality of inorganic material pieces were dispersed with a mean void ratio of 95%. The part 5a of the external electrode 5 was infiltrated to a mean depth of 10 µm into the peripheral area 31. The mean void ratio in the internal electrode layer 2 was 20%. The mean void ratio in the peripheral area 31 was determined by measuring the void ratio in each of the plurality of peripheral areas where the inorganic material pieces were dispersed, and averaging the measured values. The mean void ratio in the internal electrode layer 2 was determined similarly.

The mean depth D to which the part 5a of the external electrode 5 infiltrates was determined by measuring the depth D in each of the peripheral areas 31, and averaging the measured values. Measurement of the void ratio was carried out as follows. First, the stack 4 was polished using a desktop polishing machine KEMET-V-300 manufactured by KEMET Japan Inc. and a diamond paste. The void ratio of the peripheral area 31 and the void ratio of the internal electrode layer were measured by observing an image of a section exposed by this polishing operation, magnified 250 times by an optical microscope. The portions of the image representing the voids were painted in black and the rest was painted in white, then the void ratio was calculated as (Area of black portions)/(Area of black portions area of white portions) and represented as a percentage. A color image was converted to gray scale values so as to divide the section into black portions and white portions. To set a threshold that separates two tones of black and white, the threshold was set by visual inspection.

Then lead wires were connected to the external electrodes 5, and a DC electric field of 3 kV/mm was applied between the external electrodes 5 of positive and negative polarities via the lead wires so as to apply a polarization treatment for 15 minutes, thereby making the piezoelectric actuator based on the multi-layer piezoelectric element as shown in FIG. 1. When a DC voltage of 160 V was applied to the multi-layer piezoelectric actuator thus obtained, it underwent displacement of 40 µm in the stacking direction. Then an AC voltage changing from 0 to +160 V at a frequency of 150 Hz was applied to the multi-layer piezoelectric actuator at room temperature, to carry out a continuous operation test of $1 \times 10^9$ cycles. The results of the test are shown in Table 2.

TABLE 2

| Sample No. | Constitution of peripheral area | Arrangement of peripheral areas where inorganic compound is dispersed | Depth D of external electrode infiltrating into peripheral areas (Unit: μm) | Displacement in initial state (Unit: μm) | Displacement after $1 \times 10^9$ cycles of operation (Unit: μm) |
|---|---|---|---|---|---|
| 1 | Inorganic compound is dispersed in peripheral areas | One for every 20 layers | 10 | 40 | 40 |
| 2 | Organic compound is not dispersed in peripheral areas | — | — | 38 | 30 |

As shown in Table 2, the multi-layer piezoelectric element of the present invention (sample No. 1) underwent an amount of displacement of 40 μm after the continuous operation that was comparable to that before the continuous operation, with no abnormality found in the external electrode 5. The multi-layer piezoelectric element of sample No. 2 of which peripheral areas did not include an inorganic compound dispersed therein and a part of the external electrode did not infiltrate into the side face of the stack, on the other hand, underwent initial displacement that was 2 μm less than that of the multi-layer piezoelectric element of the present invention (sample No. 1) and underwent decreased displacement of 30 μm after $1 \times 10^9$ cycles of operation. This is because all the adjoining piezoelectric layers were firmly bonded together in the portions where the internal electrode layer was not formed (peripheral areas) due to the absence of the peripheral areas. Thus the peripheral area restricted the displacement of the stack, resulting in a smaller initial displacement than in sample No. 1. The multi-layer piezoelectric element of sample No. 2, where no part of the external electrode infiltrated into the side face of the stack, also showed lower bonding strength between the external electrode and the side face of the stack, thus resulting in peel-off of a part of the external electrode from the side face of the stack and disconnection between part of the internal electrode layer and the external electrode with failure of power supply to some piezoelectric layers and a resultant decrease in the displacement.

Example 3

Multi-layer piezoelectric elements were made similarly to Example 2, except for changing the inorganic material used to form the peripheral areas and changing the number of layers of the peripheral area The results of evaluation are shown in Table 3.

TABLE 3

| Sample No. | Inorganic compound dispersed in peripheral areas | Arrangement of peripheral areas where inorganic compound is dispersed | Displacement in initial state (Unit: μm) | Displacement after $1 \times 10^9$ cycles of operation (Unit: μm) |
|---|---|---|---|---|
| 1 | Silver | One for every 20 layers | 40 | 40 |
| 3 | PZT | One for every 20 layers | 40 | 40 |
| 4 | Silver + PZT | One for every 20 layers | 40 | 40 |
| 5 | Silver | All layers | 40 | 40 |
| 6 | PZT | All layers | 40 | 40 |
| 7 | Silver + PZT | All layers | 40 | 40 |

As shown in Table 3, sample Nos. 1, 3, 4, 5, 6 and 7 that were the multi-layer piezoelectric elements of the present invention underwent, after the continuous operation of $1 \times 10^9$ cycles, a displacement equivalent to that of before the continuous operation, thus proving that the piezoelectric actuators had high reliability.

The invention claimed is:

1. A multi-layer piezoelectric element comprising:
    a stack comprising a plurality of piezoelectric layers stacked one on another via internal electrode layers and a pair of external electrodes formed on the side face of the stack, the external electrodes being electrically connected to the plurality of internal electrode layers in every other layer,
    wherein at least a part of peripheral areas, that are disposed between two piezoelectric layers located adjacently in the stacking direction and are located between an edge of the internal electrode layer and a side face of the stack, is a dispersed area where a plurality of regions comprise an inorganic compound dispersed via voids, and
    wherein a part of the external electrode infiltrates into the dispersed area.

2. The multi-layer piezoelectric element according to claim 1, wherein the regions comprising the inorganic compound are metallic regions consisting of a metal, and the metallic regions are dispersed in the dispersed area while being insulated from the internal electrode layer.

3. The multi-layer piezoelectric element according to claim 2, wherein the metallic regions are formed of a silver-palladium alloy.

4. The multi-layer piezoelectric element according to claim 1, wherein the regions comprising an inorganic compound are ceramic regions comprising ceramics, and a plurality of ceramic regions are dispersed in the dispersed area.

5. The multi-layer piezoelectric element according to claim 4, wherein the ceramic regions connect two piezoelectric layers located adjacently in the stacking direction of the stack.

6. The multi-layer piezoelectric element according to claim 4, wherein the ceramic regions are formed from the same piezoelectric ceramics as the piezoelectric layers.

7. The multi-layer piezoelectric element according to claim 1, wherein the dispersed area includes said voids more than the internal electrode layer.

8. The multi-layer piezoelectric element according to claim 1, wherein the distance between the edge of the internal electrode layer and the side face of the stack is longer in the peripheral area that includes the dispersed e area than in the peripheral area that does not include the dispersed area.

9. The multi-layer piezoelectric element according to claim 1, wherein the stack has two or more dispersed areas that have different distances between the edge of the internal electrode layer and side face of the stack.

10. The multi-layer piezoelectric element according to claim 1, wherein the stack has a plurality of the dispersed areas, and two or more piezoelectric layers are disposed between two dispersed areas which are adjacent to each other in the stacking direction.

11. The multi-layer piezoelectric element according to claim 10, wherein the plurality of the dispersed areas are disposed at equal intervals in the stacking direction of the stack.

12. The multi-layer piezoelectric element according to claim 1, wherein each of the peripheral areas of the stack has the dispersed area formed in at least a part thereof.

13. The multi-layer piezoelectric element according to claim 12, wherein said part of the external electrode infiltrates between the regions that constitute the dispersed area.

14. The multi-layer piezoelectric element according to claim 12, wherein the peripheral area has voids that are formed so as to communicate from the edge of the internal electrode layer to a part of the external electrode.

15. The multi-layer piezoelectric element according to claim 12, wherein the stack has a plurality of the peripheral areas into which part of the external electrodes infiltrates, and the peripheral areas are disposed in an ordered arrangement in the stacking direction of the stack.

16. The multi-layer piezoelectric element according to claim 12, wherein a main component of the metallic region is same as a main component of the external electrodes.

17. The multi-layer piezoelectric element according to claim 12, wherein a cover layer made of a resin is formed on the side faces of the stack, and a part of the cover layer infiltrates into a part of the peripheral area.

18. An injection apparatus comprising a container having an injection hole and the multi-layer piezoelectric element according to claim 1, wherein a liquid contained in the container is ejected from the injection hole by the multi-layer piezoelectric element.

* * * * *